US012148651B2

(12) United States Patent
Yu et al.

(10) Patent No.: US 12,148,651 B2
(45) Date of Patent: Nov. 19, 2024

(54) CHUCK DESIGN AND METHOD FOR WAFER

(71) Applicant: Taiwan Semiconductor Manufacturing Co., Ltd., Hsinchu (TW)

(72) Inventors: Chen-Hua Yu, Hsinchu (TW); Ming-Tan Lee, Kaohsiung (TW); Hung-Jui Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/872,290

(22) Filed: Jul. 25, 2022

(65) Prior Publication Data
US 2022/0359260 A1    Nov. 10, 2022

Related U.S. Application Data

(62) Division of application No. 16/515,354, filed on Jul. 18, 2019, now Pat. No. 11,587,818.

(51) Int. Cl.
*H01L 21/683* (2006.01)
*B25B 11/00* (2006.01)
*H01L 21/687* (2006.01)
*H01L 23/00* (2006.01)

(52) U.S. Cl.
CPC ........ *H01L 21/6838* (2013.01); *B25B 11/005* (2013.01); *H01L 21/68735* (2013.01); *H01L 21/68742* (2013.01); *H01L 21/6875* (2013.01); *H01L 24/76* (2013.01); *H01L 2224/76981* (2013.01)

(58) Field of Classification Search
CPC ............ H01L 21/6838; H01L 21/6875; H01L 21/68735
See application file for complete search history.

(56) References Cited

U.S. PATENT DOCUMENTS

| | | | |
|---|---|---|---|
| 5,805,408 A * | 9/1998 | Maraschin | H01L 21/6831 361/234 |
| 5,870,271 A | 2/1999 | Herchern | |
| 8,993,380 B2 | 3/2015 | Hou et al. | |
| 9,281,254 B2 | 3/2016 | Yu et al. | |
| 9,299,649 B2 | 3/2016 | Chiu et al. | |

(Continued)

FOREIGN PATENT DOCUMENTS

| | | | | |
|---|---|---|---|---|
| JP | 2007158077 A | * | 6/2007 | ....... H01L 21/67103 |
| KR | 20130068453 A | * | 6/2013 | |

OTHER PUBLICATIONS

Vacuum Chuck for Imprint; Patent No. 20130068453; Document ID: KR 20130068453 A; Date Published: Jun. 26, 2013; Inventor Name: Kim Zin Sig; Date Filed: Dec. 15, 2011 (Year: 2013).*

*Primary Examiner* — Mahdi H Nejad
(74) *Attorney, Agent, or Firm* — Slater Matsil, LLP

(57) ABSTRACT

An apparatus for securing a wafer includes a chuck, at least one O-ring disposed on the chuck, a vacuum system connected to the chuck, such that the vacuum system comprises a plurality of vacuum holes through the chuck connected to one or more vacuum pumps, and a controller configured to control the height of the at least one O-ring relative to the top surface of the chuck. The controller is connected to pressure sensors capable of detecting a vacuum. The at least one O-ring may include a plurality of O-rings.

20 Claims, 23 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0127956 A1* | 9/2002 | Ashjaee | H01L 21/6838 451/54 |
| 2004/0166789 A1* | 8/2004 | Ashjaee | C25D 17/001 451/388 |
| 2007/0128889 A1 | 6/2007 | Goto et al. | |
| 2010/0032096 A1 | 2/2010 | Yu et al. | |
| 2014/0091537 A1 | 4/2014 | Iizuka et al. | |
| 2014/0191478 A1 | 7/2014 | Oremus | |
| 2014/0217665 A1* | 8/2014 | Cuvalci | H01L 21/6875 269/21 |
| 2014/0252710 A1 | 9/2014 | Cuvalci et al. | |
| 2015/0086301 A1 | 3/2015 | Rogers et al. | |
| 2016/0148831 A1* | 5/2016 | Greer | H01L 22/12 269/21 |
| 2018/0090352 A1* | 3/2018 | Sotoku | H01L 21/6719 |
| 2018/0108559 A1* | 4/2018 | Balan | H01L 21/68742 |
| 2018/0193983 A1 | 7/2018 | Ishino et al. | |
| 2019/0035646 A1 | 1/2019 | Nasman et al. | |
| 2020/0411359 A1 | 12/2020 | AuBuchon et al. | |
| 2021/0305077 A1 | 9/2021 | Hayashi | |

* cited by examiner

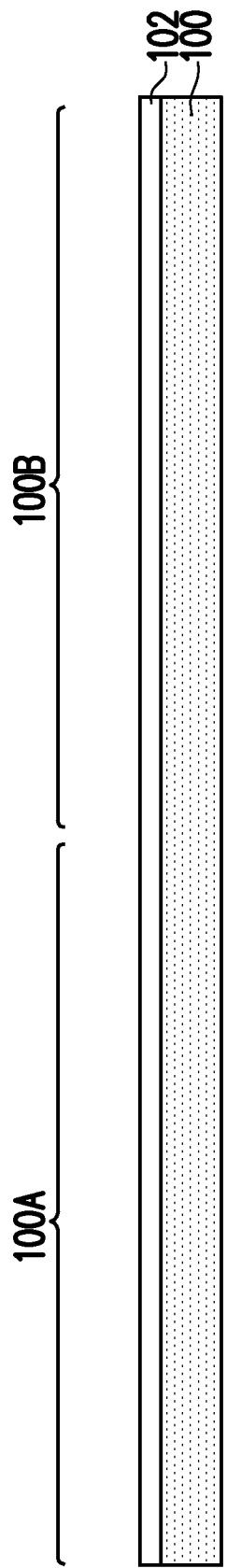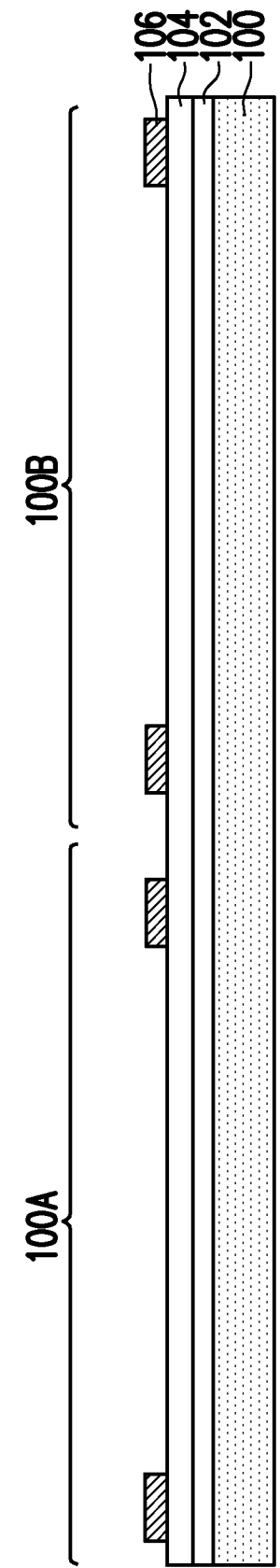

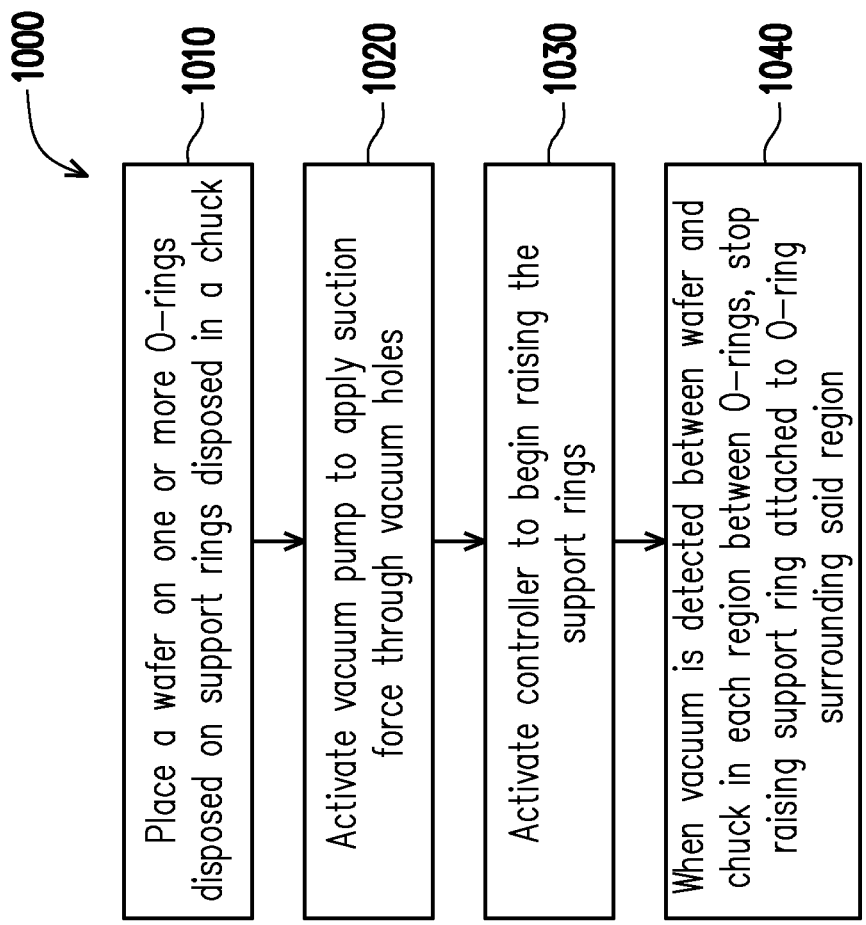

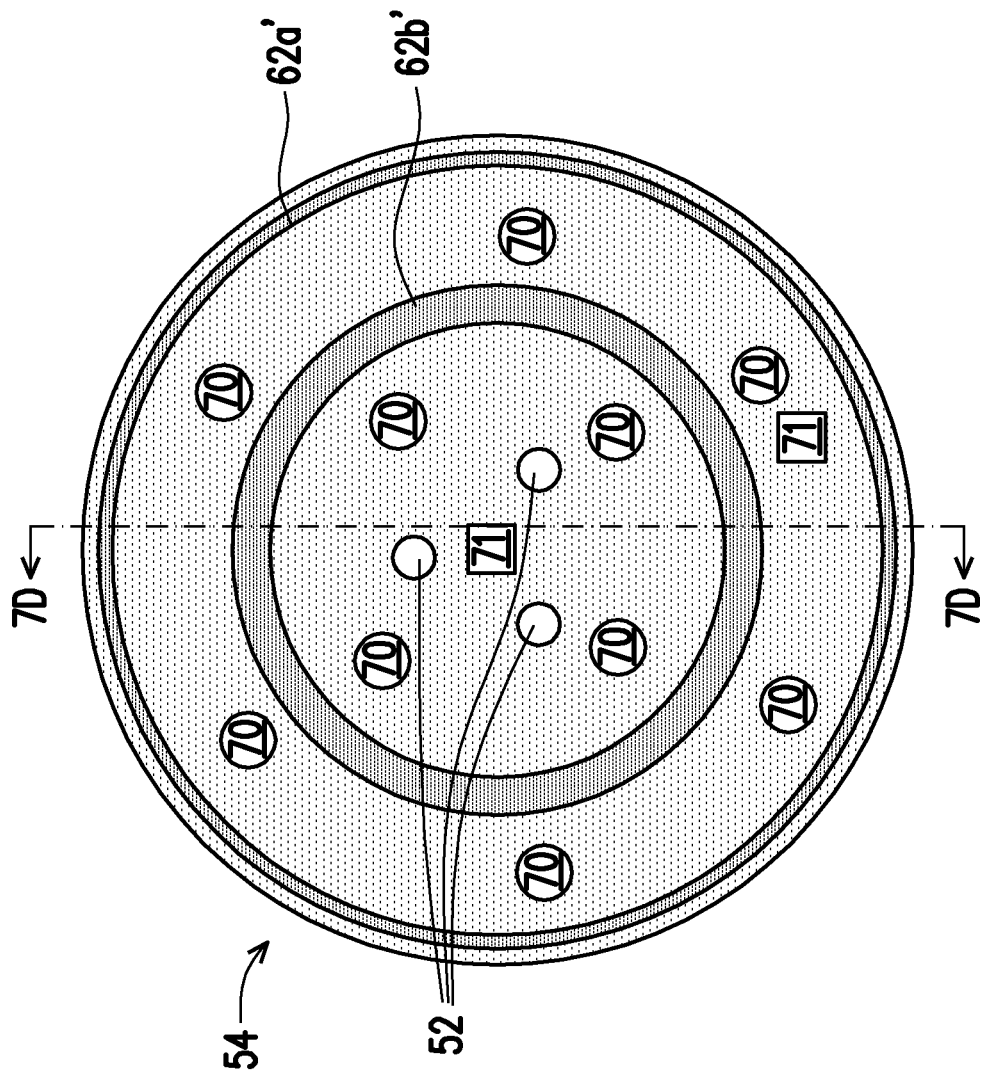

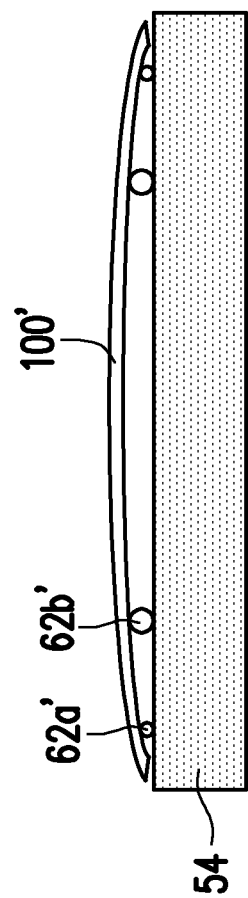

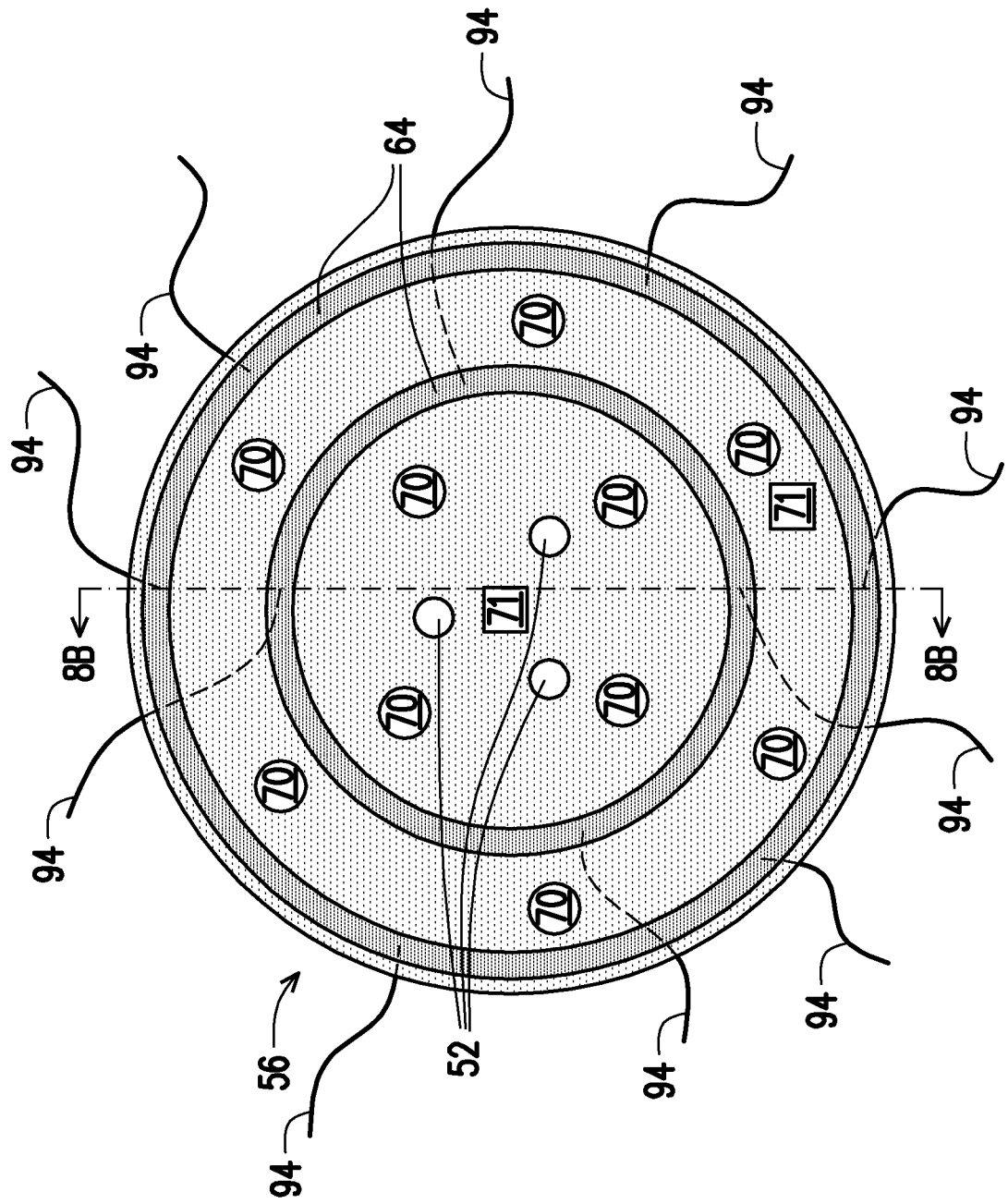

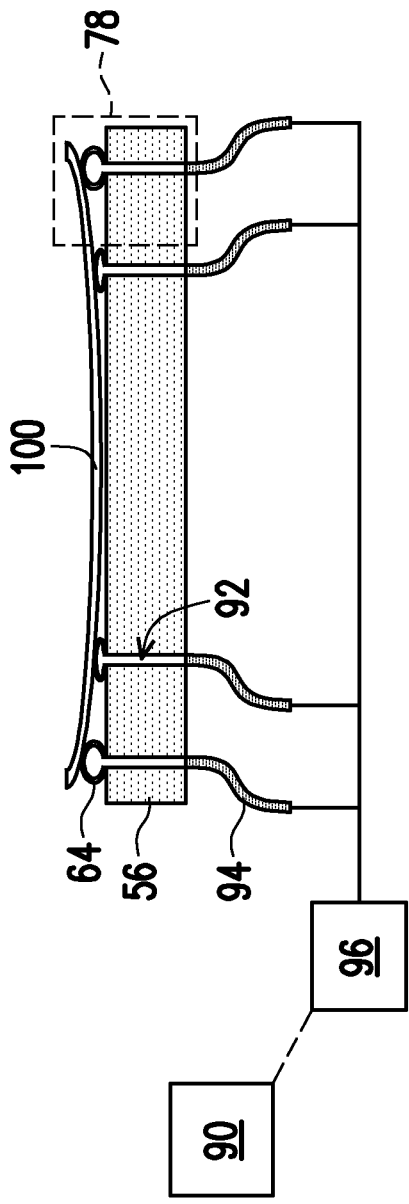
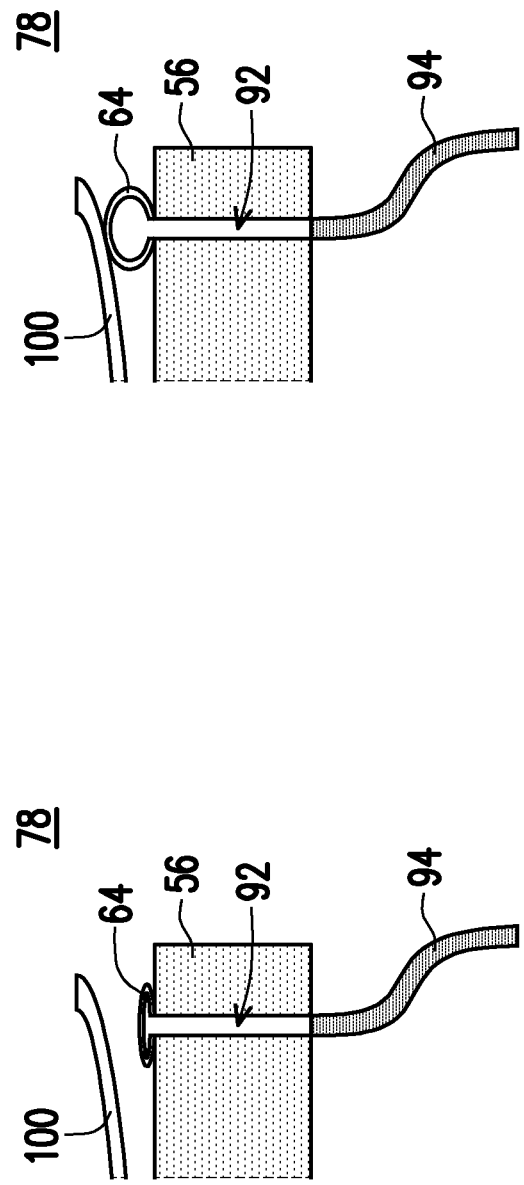

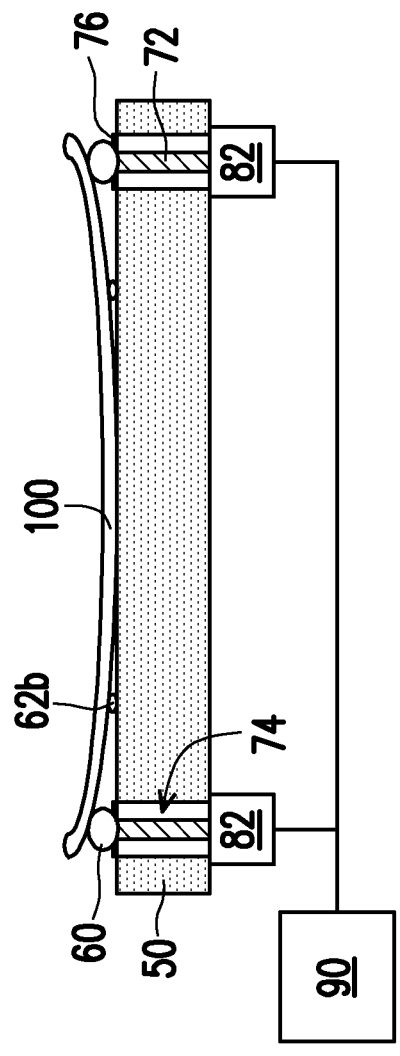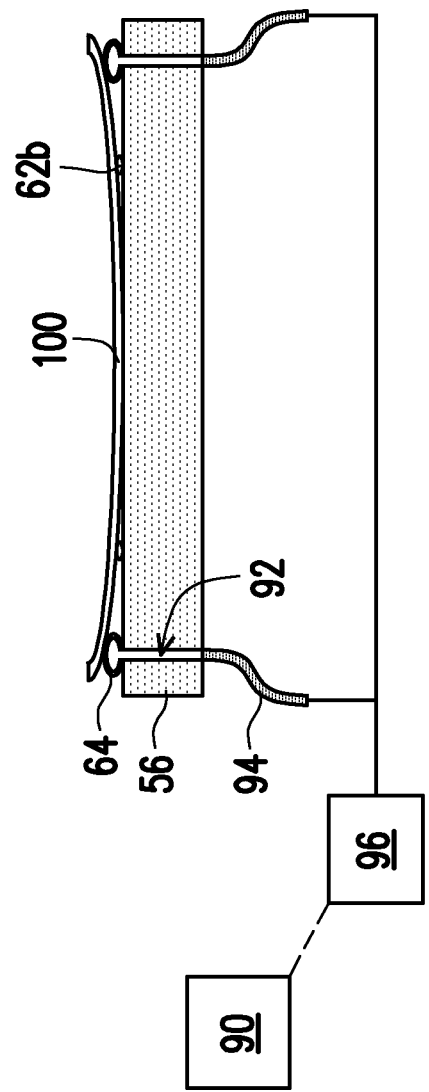

CHUCK DESIGN AND METHOD FOR WAFER

PRIORITY CLAIM AND CROSS-REFERENCE

This application is a divisional of U.S. patent application Ser. No. 16/515,354, filed on Jul. 18, 2019, entitled "Chuck Design and Method for Wafer," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. In the processing of semiconductor wafers, warpage and stiffness of the wafers may occur. This wafer warpage and stiffness can increase the difficulty of securing wafers in place during semiconductor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-5 illustrate varying views of intermediary steps of manufacturing a semiconductor package according to various embodiments.

FIG. 6E is a flow diagram illustrating a method of securing a substrate to a chuck in accordance with some embodiments.

FIGS. 7A-7D illustrate varying views of another chuck and O-rings in accordance with some embodiments.

FIGS. 8A-8D illustrate varying views of yet another chuck and O-rings in accordance with some embodiments.

FIGS. 9A and 9B illustrate cross section views of other chucks and O-rings in accordance with some embodiments.

DETAILED DESCRIPTION

Figure 3:
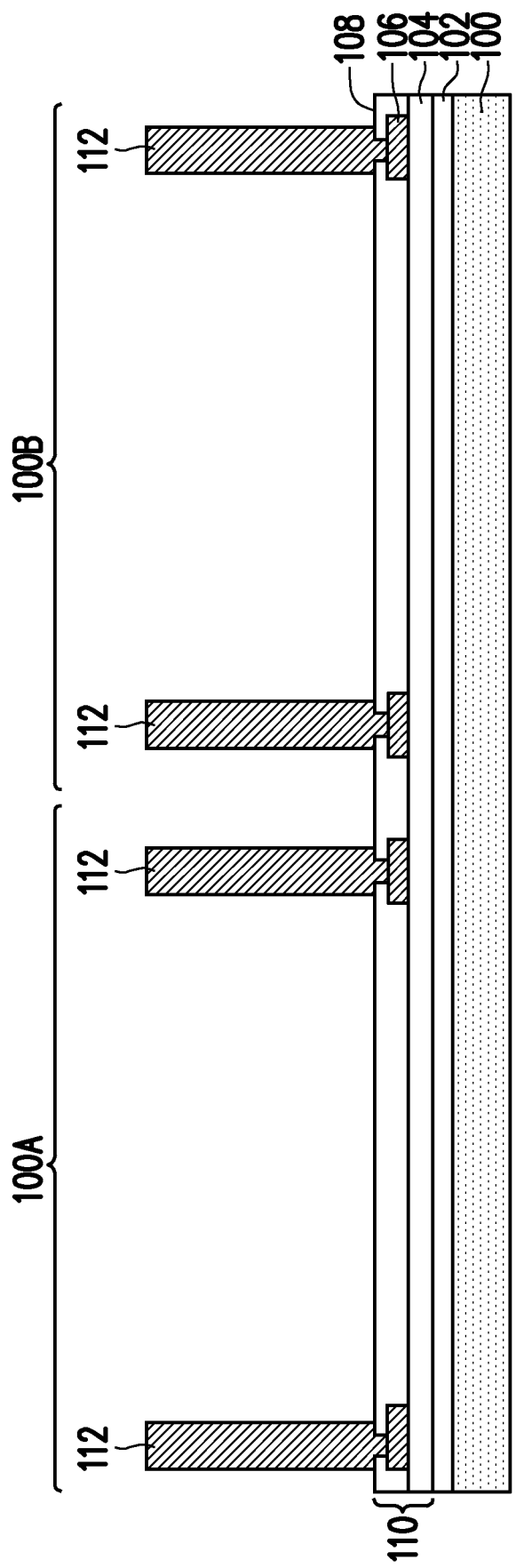

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of chuck designs for securing substrates are described below. It should be understood that the various embodiment structures and methods described herein can be applied to the fabrication of any type of semiconductor structure including, for example, an integrated fan-out (InFO) package, a finFET device, a chip on wafer on substrate (CoWoS) package, a fan-in package, or the like, at any step of a process requiring securing a wafer or substrate to a chuck.

When processing semiconductor wafers during fabrication of devices such as, e.g. InFO packages, the wafer may be secured to a chuck by a vacuum seal maintained by O-rings on the surface of the chuck. However, warped wafer profiles may prevent proper contact between a bottom surface of the wafer and the O-rings, leading to vacuum seal loss and detachment of the wafer from its position on the chuck. High warpage wafers may be too stiff to be sufficiently flattened by the vacuum effect of the chucks. Advantageous elements of the embodiments disclosed herein are directed towards maintaining the vacuum seal between a wafer and a chuck with variable height O-rings designs. A processing tool for semiconductor fabrication may contain the wafer and chuck. Loss of the vacuum seal between the wafer and the chuck may trigger an alarm of the processing tool and halt the fabrication process. By preventing loss of the vacuum seal, the variable height O-ring designs can reduce the amount of processing time lost due to the vacuum seal alarm being triggered. Additionally, the position of the chuck is maintained on the chuck more securely to avoid misalignment of fabrication processes on the wafer.

The variable height O-ring designs for chucks disclosed herein are useful for any process that requires securing a wafer or substrate to a chuck. For example, large InFO package wafers often exhibit relatively large degrees of warpage and stiffness. By maintaining the wafer securely on the chuck with reduced frequency of vacuum loss, photolithography processes such as scan stepping may be performed with greater efficiency. It should be understood that the variable height O-ring designs for chucks disclosed herein are not limited to use in InFO package photolithography and could be applied for any fabrication process that may occur to a practitioner with ordinary skill in the art.

FIGS. 1 through 5 illustrate cross-sectional views of earlier steps during a process for forming a first package structure in accordance with some embodiments (e.g., to form a component of an InFO package). FIG. 1 illustrates a carrier wafer 100 (e.g., a carrier substrate) and a release layer 102 formed on the carrier wafer 100. A first package region 100A and a second package region 100B for the formation of a first package and a second package, respectively, are illustrated.

The carrier wafer 100 may be a wafer, such that multiple packages can be formed on the carrier wafer 100 simultaneously. In some embodiments, the carrier wafer 100 may be a glass wafer, a ceramic wafer, or the like. The release layer 102 may be formed of a polymer-based material, which may be removed along with the carrier wafer 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be a ultra-violet (UV) glue, which loses its adhesive property when exposed to UV lights. The release layer 102 may be dispensed as a liquid and cured, may be a laminate film laminated onto the carrier wafer 100, or may be the like. The top surface of the release layer 102 may be leveled and may have a high degree of planarity.

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. One or more exposure steps may be applied to the photoresist to define the metallization pattern 106. After the one or more exposures, the photo resist is developed to form openings through the photo resist to expose the seed layer. In some embodiments, stitching lithography processes may be employed to define the metallization pattern 106. Alternatively, multiple exposure steps may be used to define the metallization pattern 106, with each exposure step defining a separate pattern that is not interconnected, for example, at any stitching regions.

A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 3, an optional dielectric layer 108 is formed on the metallization pattern 106 and the dielectric layer 104. In some embodiments, the dielectric layer 108 is formed of a substantially similar material and using substantially similar methods as the dielectric layer 106. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization patterns and dielectric layers may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns. In other embodiments, the back-side redistribution structure 110 may be omitted in its entirety such that subsequently described features are formed directly on the release layer 102.

Further in FIG. 3, through vias 112 are formed. As an example to form the through vias 112, an optional seed layer is formed over the back-side redistribution structure 110, e.g., the dielectric layer 108 and the exposed portions of the metallization pattern 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to the through vias 112. One or more exposure steps may be applied to the photoresist to define the through vias 112. After the one or more exposures, the photo resist is developed to form openings through the photo resist to expose the seed layer.

A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112. Alternatively, in embodiments where the dielectric layer 108 is omitted, the seed layer may also be omitted, and the metallization pattern 106 may be used as a seed layer to plate the through vias 112. For example, in such embodiments, the through vias 112 may be plated directly on the metallization pattern 106.

Figure 4:
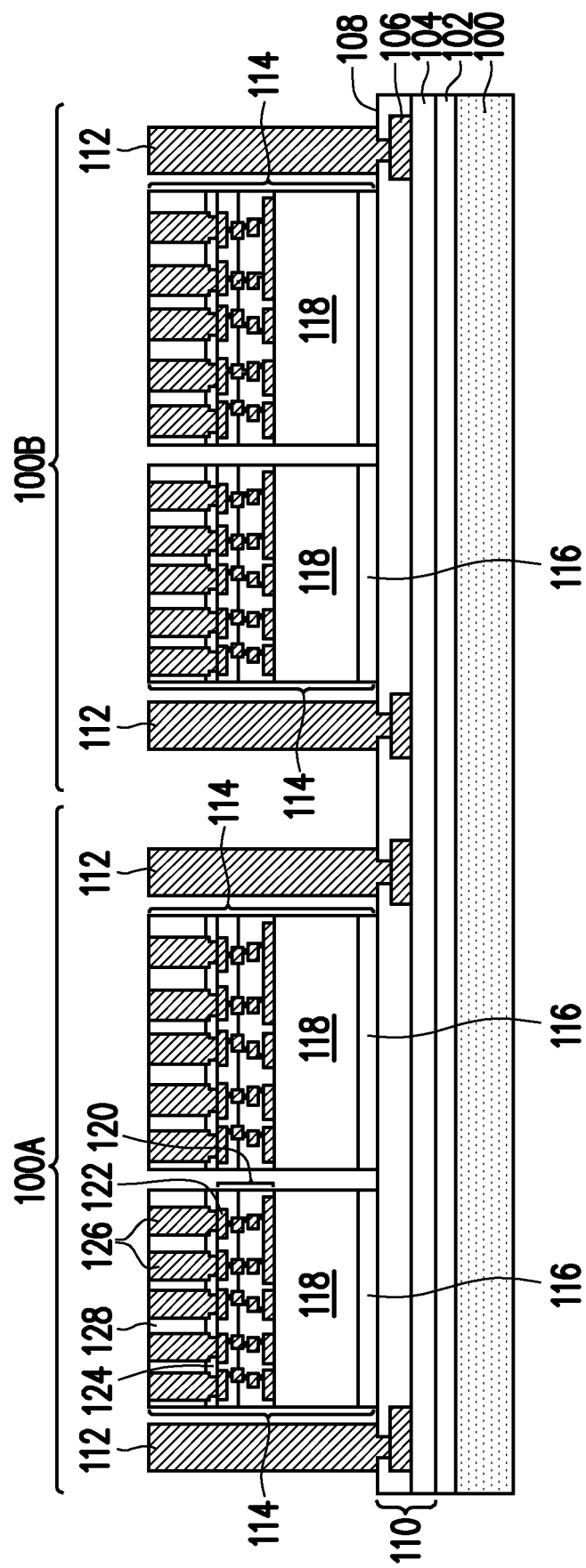

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region or three or more integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the carrier 100, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are formed through the passivation films 124 to the pads 122. Die connectors 126, such as conductive pillars (for example, comprising a metal such as copper), extend through the passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and in some embodiments, the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in FIG. 4. Alternatively, in embodiments where the dielectric layer 108 is omitted, the adhesive 116 may adhere the integrated circuit dies to the metallization pattern 106 and/or the dielectric layer 104. In such embodiments, the adhesive 116 may extend along a top surface and sidewalls of the metallization pattern 106. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier wafer 100. The integrated circuit dies 114 may be singulated, such as by sawing or dicing, and adhered to the back-side redistribution structure 110 by the adhesive 116 using, for example, a pick-and-place tool.

Figure 5:
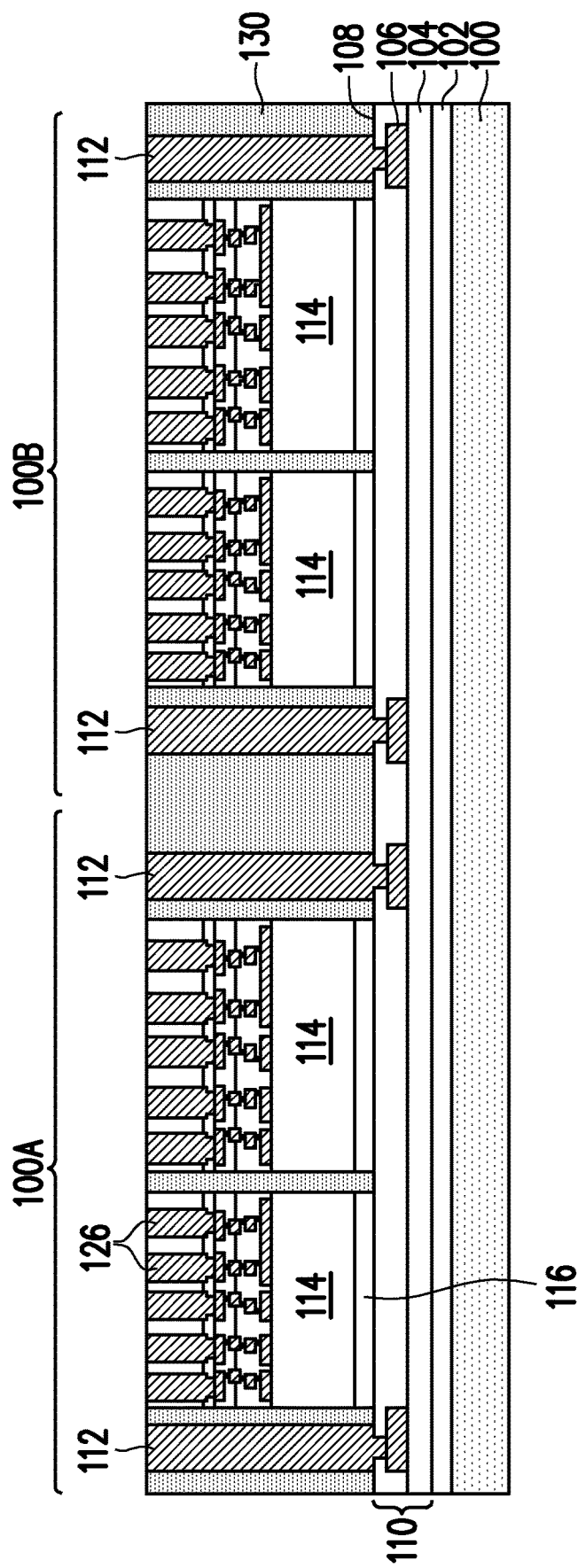

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. In some embodiments, top surfaces of the through vias 112, die connectors 126, and encapsulant 130 are coplanar after the grinding process. In some embodiments, the grinding may be omitted, for example, if through vias 112 and die connectors 126 are already exposed.

The carrier wafer 100 may become warped and/or may exhibit an increased degree of stiffness. This may be due to the attachment of the integrated circuit dies 114 and the curing of the encapsulant 130 exerting strain on the carrier wafer 100 due to, for example, differences in the coefficient of thermal expansion (CTE) of the various materials. The warped wafer phenomenon may arise from CTE mismatch between materials including carriers, dies, dielectric material, and molding compounds. In order to properly hold the carrier wafer 100 in place for fabrication processes such as, e.g. stitching lithography with scan stepping, chucks such as those described below with variable height O-ring designs may be used.

Figure 6A:
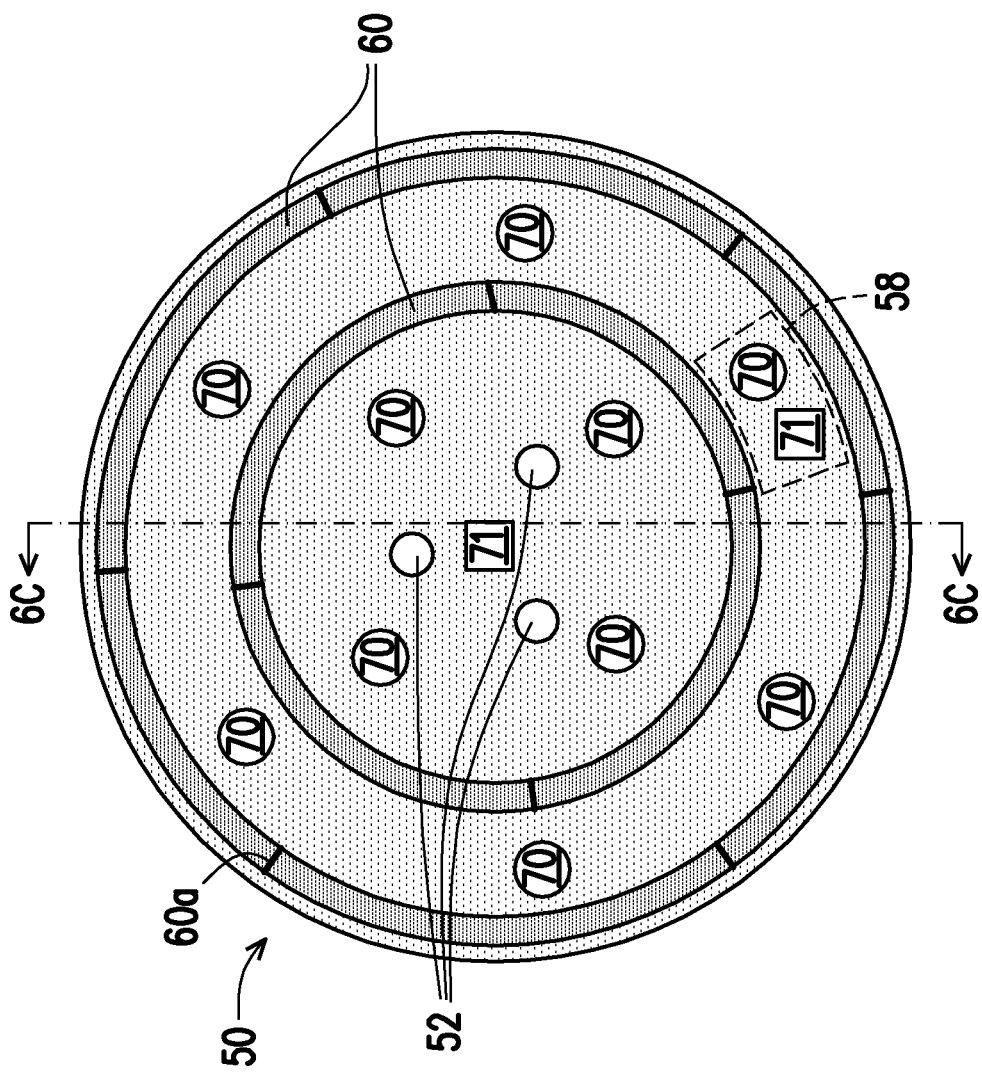
FIGS. 6A-6D illustrate varying views of a chuck and O-rings in accordance with some embodiments.

FIGS. 6A-6D illustrate a chuck 50 in accordance with an embodiment of an apparatus comprising an automatic system for configuring O-ring heights. FIG. 6A illustrates the chuck 50 in a top view. The chuck 50 may comprise a material such as stainless steel, aluminum, or ceramics. In some embodiments, the chuck comprises several lift pins 52 that can be mechanically raised and lowered to control the vertical position of an object such as, e.g., a semiconductor wafer with respect to a top surface of the chuck 50. O-rings 60 are disposed on the top surface of the chuck 50 as illustrated in FIG. 6A. The O-rings 60 may comprise materials such as polybutadiene, silicone rubber, nitrile rubber, butyl rubber, natural rubber, or other elastomers. In the embodiment illustrated in FIG. 6A, two O-rings 60 are disposed on the chuck 50. In some embodiments, there may be a single O-ring 60 or more than two O-rings 60 disposed on the chuck 50. The O-rings 60 may be disposed on support rings 72 (illustrated and described below with respect to FIGS. 6C and 6D). The support rings 72 may be single continuous rings or may comprise a plurality of segments, each capable of moving up and down independently, separated at segment boundaries 60a as illustrated in FIG. 6A. The segment boundaries 60a may comprise stainless steel. The plurality of segments of the support rings 72 may provide an additional advantage of being able to accommodate wafers having unequal or uneven warpage. Vacuum holes 70 are disposed through the chuck in zones between and inside the O-rings 60. To detect if a vacuum is being maintained between the carrier wafer 100 and the chuck 50 by the O-rings 60, pressure sensors 71 may be disposed on the surface of the chuck in the zones between and inside the O-rings 60, with at least one pressure sensor 71 in each zone between and inside the O-rings 60.

Figure 6C:
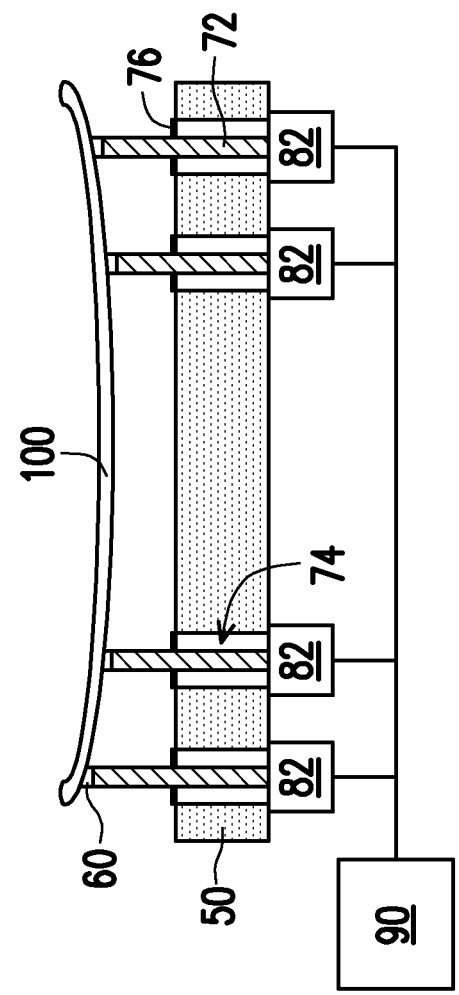
Figure 6B:
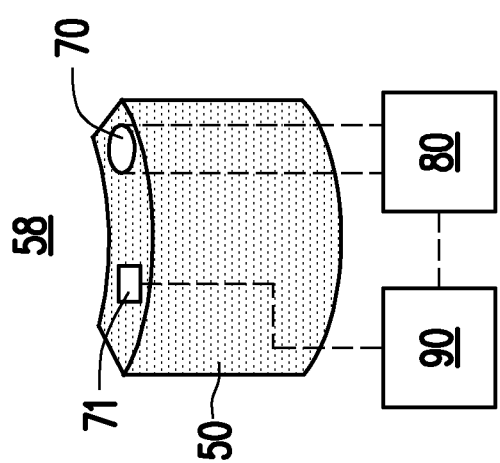

FIG. 6B illustrates a detailed 3D view of region 58 of the chuck 50, showing one vacuum hole 70 disposed through the chuck 50 and one pressure sensor 71 disposed on the surface of the chuck 50. The vacuum holes 70 are connected to a vacuum pump 80 or other device configured to produce and maintain a vacuum. In some embodiments, the pressure sensors 71 are connected to a controller 90 through the chuck 50. In other embodiments, the pressure sensors 71 may be disposed inside the vacuum holes 70 or may be internal components of the vacuum pump 80. In some embodiments, the controller 90 comprises a programmable computer. The controller 90 is illustrated as a single element for illustrative purposes. In some embodiments, the controller 90 may comprise multiple elements. The controller 90 is configured to adjust the height of the O-rings 60 as necessary to establish and maintain a vacuum between the carrier wafer 100 and the chuck 50, as explained in more detail below with respect to FIG. 6C. The vacuum pump 80 may be connected to the controller 90. The O-rings 60 form a seal between the chuck 50 and the carrier wafer 100, allowing the vacuum to be maintained and hold the carrier wafer 100 in place on the chuck 50.

Figure 6D:
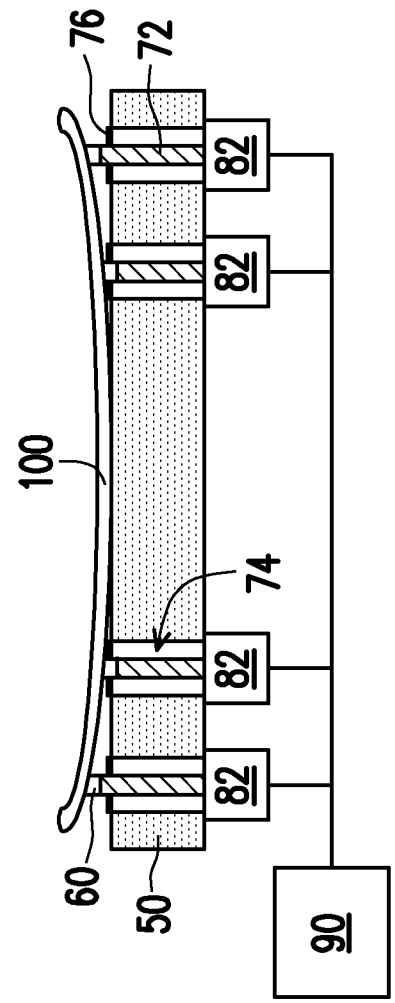

FIG. 6C illustrates a cross section view of the chuck 50 along cross section 6C-6C as illustrated in FIG. 6A. The carrier wafer 100 is disposed on the O-rings 60. The carrier wafer 100 may exhibit high warpage and stiffness so that it cannot be flattened by the force exerted through the vacuum holes 70. The O-rings 60 are disposed on the support rings 72. In some embodiments, the O-rings 60 may be attached directly to the support rings 72 by an adhesive such as, e.g., an epoxy, which may extend along the circumference of the O-rings. The support rings 72 are disposed in circular trenches 74 through or into the chuck 50, passing through circular seals 76 in the surface of the chuck 50. The support rings 72 are attached to electric motors 82 capable of raising and lowering each support ring 72 and/or each segment of the support rings 72 independently. The electric motors 82 are connected to the controller 90, which is configured to set the height of each support ring 72 and/or each segment of the support rings 72 independently by controlling the corresponding electric motor 82. FIG. 6D illustrates the position of the carrier wafer 100 and the support rings 72 with the support rings 72 in a lowered position. The support rings 72 may be lowered to this position after vacuum seals are established. Tops of the support rings 72 farther from the center of the chuck 50 will be at a higher position than tops of the support rings 72 closer to the center of the chuck 50. In the embodiments illustrated by FIGS. 6C and 6D, the carrier wafer 100 exhibits warpage so that its midpoint is at a lower position relative to the top surface of the chuck 50 than outer edges of the carrier wafer 100.

FIG. 6E illustrates a method 1000 of securing a substrate (e.g., the carrier wafer 100) to a chuck as depicted in FIGS. 6A-6D. In step 1010, the carrier wafer 100 is placed on the O-rings 60. In step 1020, the vacuum pump 80 is activated and begins applying a suction force through the vacuum holes 70. The circular seals 76 at the top openings of the circular trenches 74 prevent a loss of vacuum through the circular trenches 74. In step 1030, the controller 90 begins to raise the segments of the support rings 72 by actuating the electric motors 82. In an embodiment, the controller 90 is configured to automatically raise and/or lower the support rings 72. In another embodiment, the controller 90 may be configured to allow the vertical positions of each support ring 72 to be controlled manually by a human operator. In another embodiment, step 1030 may be performed before step 1020.

In step 1040, the raising of each support ring 72 is stopped when a vacuum is detected between the carrier wafer 100 and the chuck 50. In some embodiments, the controller 90 will raise the support rings 72 in unison until the pressure sensor 71 in one zone, e.g. the zone inside the inner O-ring 60 and inner support ring 72 as illustrated in FIG. 6A, detects a vacuum, indicating the formation of a seal. The controller 90 will then stop raising the segments of the inner support ring 72 attached to the inner O-ring 60. The segments of the outer support ring 72 attached to the outer O-ring 60 will continue to be raised until the pressure sensor 71 in the zone between the inner and outer O-rings 60 detects a vacuum, indicating the formation of a seal in the zone between the inner and outer O-rings 60. The controller 90 will then stop raising the segments of the outer support ring 72 attached to the outer O-ring 6. In other embodiments, the controller 90 may be configured to raise individual segments of the support rings 72 to different heights to compensate for irregular warpage of the carrier wafer 100. Once vacuum seals have been established in every zone, the support rings 72 may be lowered so that the bottom of the O-ring 60 with a lower relative position is level with the top surface of the chuck 50, as illustrated in FIG. 6D.

In some embodiments, the carrier wafer 100 may exhibit warpage in the opposite direction from the warpage illustrated in FIG. 6C, so that the midpoint of the carrier wafer 100 is at a higher position relative to the top surface of the chuck 50 than outer edges of the carrier wafer 100. In this embodiment, the support rings 72 may be raised by the controller 90 by a method similar to method 1000 illustrated in FIG. 6E. The controller 90 will raise the inner support ring 72 while keeping the outer support ring 72 stationary until the pressure sensor 71 in one zone, e.g. the zone inside the inner and O-ring 60 as illustrated in FIG. 6A, detects a vacuum, indicating the formation of a seal. The controller 90 will then stop raising the segments of the inner support ring 72 attached to the inner O-ring 60. Next, the controller 90 will raise the segments of the outer support ring 72 attached to the outer O-ring 60 until the pressure sensor 71 in the zone between the inner and outer O-rings 60 detects a vacuum, indicating the formation of a seal in the zone between the inner and outer O-rings 60. The controller 90 will then stop raising the segments of the outer support ring 72 attached to the outer O-ring 60. Once vacuums are established and the raising process ends, tops of the segments of the outer support ring 72 farther from the center of the chuck 50 will be at lower positions than tops of the segments of the inner support ring 72 closer to the center of the chuck 50. Other embodiments of changing the vertical positions of the support rings 72 when more than two O-rings 60 are present on the chuck 50 may be substantially similar to the embodiments disclosed above.

Figure 7A:
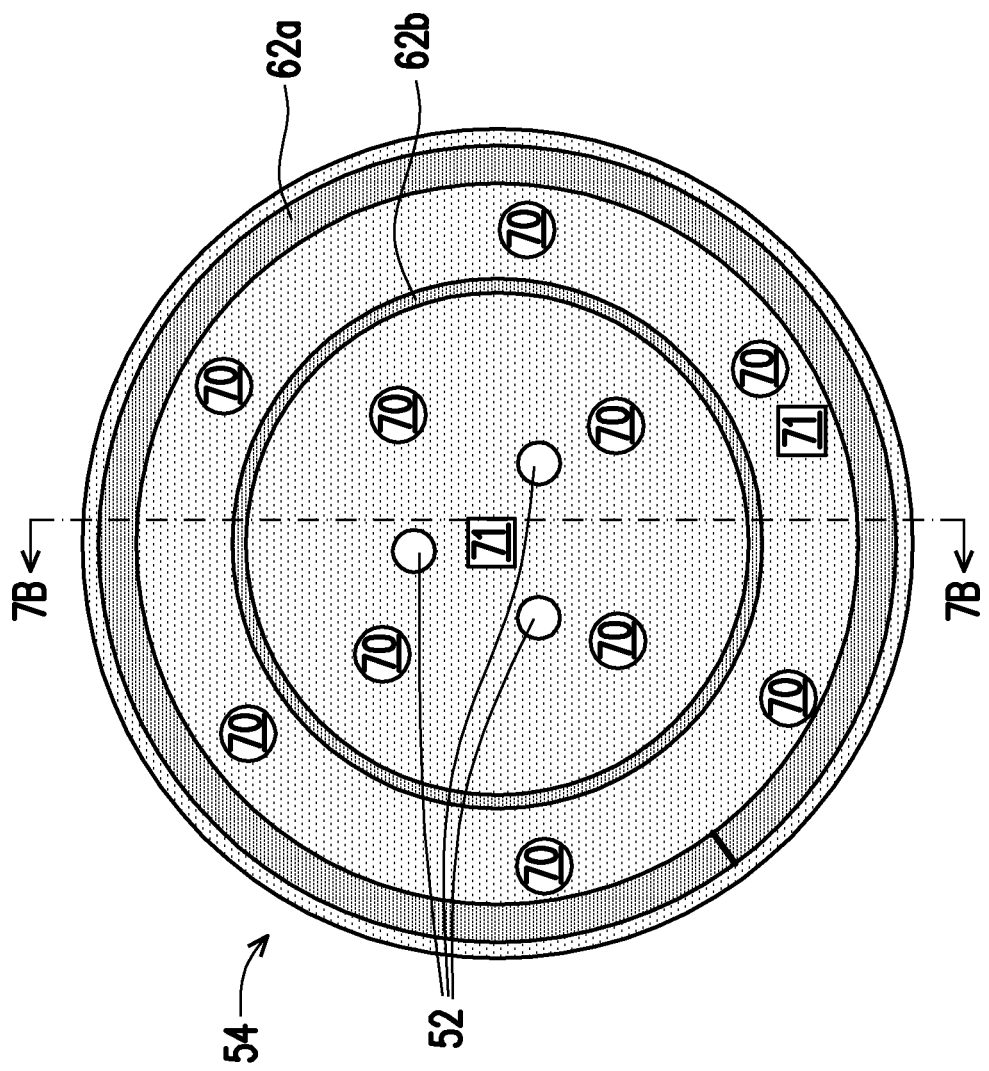
Figure 7B:
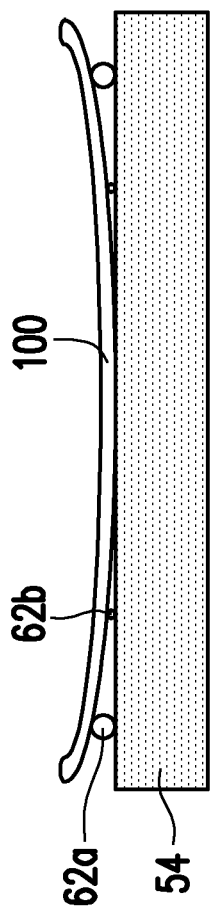

FIGS. 7A and 7B illustrate a chuck 54 in accordance with some embodiments of an apparatus comprising O-rings 62 with fixed positions and different thicknesses. FIG. 7A illustrates the chuck 54 in a top view. The chuck 54 may comprise substantially similar materials as chuck 50, as described above with respect to FIG. 6A. O-rings 62 may be disposed on the top surface of the chuck 54 as illustrated in FIG. 7A. The O-rings 62 may comprise materials such as polybutadiene, silicone rubber, nitrile rubber, butyl rubber, natural rubber, or other elastomers. In the embodiment illustrated in FIG. 7A, two O-rings 62a and 62b are disposed on the chuck 54. In some embodiments, there may be more than two O-rings 62 disposed on the chuck 54. Vacuum holes 70 are disposed between the O-rings 62 in a substantially similar manner as described above with respect to FIG. 6B and connected to vacuum pump 80 (not illustrated). Pressure sensors 71 may be disposed to detect if a vacuum is being maintained within each zone between the carrier wafer 100 and the chuck 54 by the O-rings 62. The pressure sensors 71 may be attached to a surface of the chuck 54 or may be integrated into the vacuum pump 80.

FIG. 7B illustrates a cross section view of the chuck 54 along cross section 7B-7B as illustrated in FIG. 7A. The carrier wafer 100 is disposed on the O-rings 62. The carrier wafer 100 may exhibit high warpage and stiffness in a substantially similar manner as described above with respect to FIG. 6C. In the illustrated embodiment, the thickness and the width of the outer O-ring 62a are larger than the thickness and the width of the inner O-ring 62b. In other embodiments, O-rings with different thicknesses but substantially identical widths could be used. The relatively larger thickness of the O-ring 62a enables the formation of a secure seal between the outer portion of the carrier wafer 100 that displays the most warpage and the chuck 54, and the relatively smaller thickness of the O-ring 62b enables the formation of a secure seal between the inner portion and the outer portion of the carrier wafer 100 and the chuck 54. In an embodiment, the thickness of the outer O-ring 62a may be between about 2 mm and about 3 mm, and the thickness of the inner O-ring may be between about 0.5 mm and about 1.5 mm. In other embodiments, O-rings of different thicknesses may be used. In some embodiments, the O-rings 62 are attached to the top surface of the chuck 54 by an adhesive such as, e.g., an epoxy. In other embodiments, the O-rings 62 rest in respective grooves in the top surface of the chuck 54 and may be secured with an adhesive or may rest on the top surface of the chuck without an adhesive.

In some embodiments, such as illustrated in FIGS. 7C and 7D, a carrier wafer 100' may exhibit warpage in the opposite direction from the warpage illustrated in FIG. 7B, so that the midpoint of carrier wafer 100' is at a higher position relative to the top surface of the chuck 54 than outer edges of the carrier wafer 100'. In this embodiment, an outer O-ring 62a' may have a smaller thickness than the thickness of an inner O-ring 62b'. In other embodiments, more than two O-rings 62 of different thicknesses may be placed on the chuck 54 to secure the carrier wafer 100.

Figure 7E:
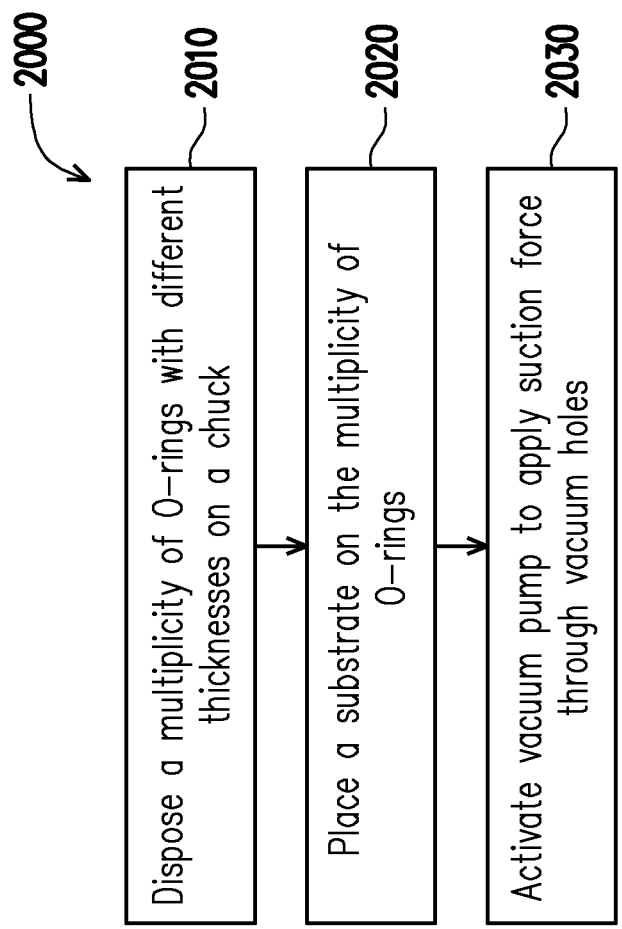
FIG. 7E is a flow diagram illustrating another method of securing a substrate to the chuck in accordance with some embodiments.

FIG. 7E illustrates a method 2000 of securing a substrate to a chuck as depicted in FIGS. 7A and 7B. In step 2010, a plurality of O-rings 62 with different thicknesses is disposed on the chuck 54. In step 2020, the carrier wafer 100 is placed on the plurality of O-rings 62. In step 2030, the vacuum pump 80 is activated and begins applying a suction force through the vacuum holes 70, forming seals between the carrier wafer 100 and the chuck 54.

FIGS. 8A-D illustrate a chuck 56 in accordance with some embodiments of an apparatus comprising pneumatic O-rings 64. FIG. 8A illustrates the chuck 56 in a top view. The chuck 56 may comprise substantially similar materials as chuck 50, as described above with respect to FIG. 6A. Pneumatic O-rings 64 may be disposed on the surface of the chuck 54 as illustrated in FIG. 8A. The pneumatic O-rings 64 are inflatable toruses that may comprise materials such as polybutadiene, silicone rubber, nitrile rubber, butyl rubber, natural rubber, or other elastomers. In the embodiment illustrated in FIG. 8A, two pneumatic O-rings 64 are disposed on the chuck 56. In some embodiments, there may be one or more than two pneumatic O-rings 64 disposed on the chuck 56. In some embodiments, the pneumatic O-rings 64 are attached to the top surface of the chuck 56 by an adhesive such as, e.g., an epoxy. In other embodiments, the pneumatic O-rings 64 rest in respective grooves in the top surface of the chuck 56 and may be secured with an adhesive or may rest on the top surface of the chuck without an adhesive. Vacuum holes 70 are disposed through the chuck 56 in zones between the pneumatic O-rings 64 in a substantially similar manner as described above with respect to FIG. 6B and connected to vacuum pump 80 (not illustrated). Pressure sensors 71 in each zone detect if a vacuum is being maintained between the carrier wafer 100 and the chuck 56 by the pneumatic O-rings 64 within each corresponding zone. The pressure sensors 71 may be disposed on the surface of the chuck in the zones between and inside the pneumatic O-rings 64, with at least one pressure sensor 71 in each zone between and inside the pneumatic O-rings 64, or integrated with the vacuum pump 80. Pneumatic pipes 94 connect to the underside of the chuck 56.

FIG. 8B illustrates a cross section view of the chuck 56 along cross section 8B-8B as illustrated in FIG. 8A. The carrier wafer 100 is disposed on the pneumatic O-rings 64. The carrier wafer 100 may exhibit high warpage and stiffness in a substantially similar manner as described above with respect to FIG. 6C. The pneumatic O-rings 64 are attached to pneumatic holes 92 through the chuck 56. In an embodiment, the pneumatic O-rings 64 are attached to cover upper outlets of the pneumatic holes 92. The pneumatic pipes 94 are attached to the lower outlets of pneumatic holes 92 and to a pump or compressor or a multiplicity of pumps or compressors 96. The pneumatic O-rings 64 are inflated to form seals between the carrier wafer 100 and the chuck 56 as illustrated. The embodiments illustrated in FIGS. 8A and 8B show six pneumatic pipes 94 attached to the outer pneumatic O-ring 64 and four pneumatic pipes 94 attached to the inner pneumatic O-ring 64. In other embodiments, a smaller or larger number of pneumatic pipes 94 and pneumatic holes 92 may be attached to each pneumatic O-ring 64. The pneumatic O-rings 64 may have different properties, such as, e.g. the outer O-ring 64 may have a larger radius than the inner O-ring 64 as illustrated in FIG. 8A, and the outer O-ring 64 may be inflatable to a greater thickness than the inner O-ring 64 with the same pressure applied.

FIGS. 8C and 8D illustrate detailed views of region 78 of FIG. 8B showing the operation of the pneumatic O-rings 64. FIG. 8C illustrates the pneumatic O-ring 64 prior to inflation. The pneumatic O-ring 64 is in a substantially flat state and is not in contact with the lower surface of the carrier wafer 100. FIG. 8D illustrates the pneumatic O-ring 64 after inflation. Pressurized gas (e.g., air) from the pumps 96 has been injected through the pneumatic hose 94 and the pneumatic hole 92 into the pneumatic O-ring 64, inflating the pneumatic O-ring 64 so that it contacts the lower surface of the carrier wafer 100 to form a seal. In an embodiment, the thickness of the inflated outer pneumatic O-ring 64 may be between about 2 and about 3 mm, and the thickness of the inflated inner O-ring 64 may be between about 0.5 mm and about 1.5 mm. In other embodiments, pneumatic O-rings 64 of different inflated thicknesses may be used.

Figure 8E:
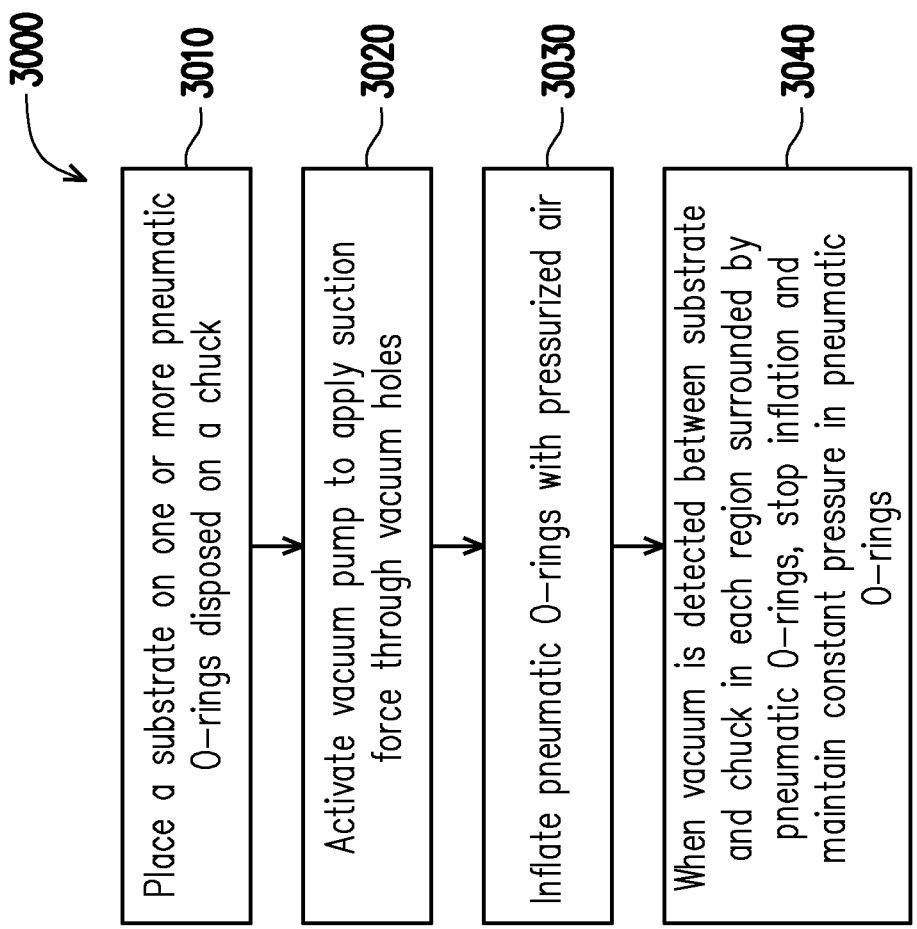
FIG. 8E is a flow diagram illustrating a method of securing a substrate to the chuck in accordance with some embodiments.

FIG. 8E illustrates a method 3000 of securing a substrate to a chuck as depicted in FIGS. 8A-D. In step 3010, the carrier wafer 100 is placed on one or more pneumatic O-rings 64 disposed on the chuck 56. In step 3020, the vacuum pump 80 is activated and begins applying a suction force through the vacuum holes 70. In an embodiment, the pumps 96 and the pressure sensors 71 connected to the vacuum pump 80 are further connected to controller 90 configured to automatically stop the inflation of the pneumatic O-rings 64 and maintain the inflation at a constant pressure when vacuum is detected. In step 3030, the pneumatic O-rings 64 are inflated with pressurized gas provided by one or more pumps 96 through the pneumatic pipes 94 and pneumatic holes 92. In step 3040, the inflation of the pneumatic O-rings 64 is stopped and maintained at a constant pressure when vacuum is detected between the carrier wafer 100 and the chuck 56 by the pressure sensors 71 connected to the vacuum pump 80.

In some embodiments, the controller 90 will inflate the pneumatic O-rings 64 in unison until the pressure sensor 71 in one zone, e.g. the zone enclosed by the inner pneumatic O-ring 64 as illustrated in FIG. 8A, detects a vacuum, indicating the formation of a seal. The controller 90 will then instruct the air pumps 96 connected to the inner pneumatic O-ring 64 to stop inflating and maintain the inner pneumatic O-ring 64 at a constant pressure. The air pumps 96 attached to the outer pneumatic O-ring 64 will continue to inflate the outer pneumatic O-ring 64 until the pressure sensor 71 in the zone between the inner and outer pneumatic O-rings 64 detects a vacuum, indicating the formation of another seal. The controller 90 will then instruct air pumps 96 attached to the outer pneumatic O-ring 64 to stop to stop inflating and maintain the outer pneumatic O-ring 64 at a constant pressure. In some embodiments, the air pumps 96 may be configured to allow the pressure of each pneumatic O-ring 64 to be controlled manually by a human operator.

In some embodiments, the carrier wafer 100 may exhibit warpage in the opposite direction from the warpage illustrated in FIG. 8B, so that the midpoint of the carrier wafer 100 is at a higher position relative to the top surface of the chuck 54 than outer edges of the carrier wafer 100. In these embodiments, the outer pneumatic O-ring 64 may be inflated to a smaller thickness than the thickness of the inflated inner O-ring 64. The controller 90 will inflate the inner pneumatic O-ring 6 until the pressure sensor 71 in the zone enclosed by the inner pneumatic O-ring, as illustrated in FIG. 8A, detects a vacuum, indicating the formation of a seal. The controller 90 will then instruct the air pumps 96 connected to the inner pneumatic O-ring 64 to stop inflating and maintain the outer pneumatic O-ring 64 at a constant pressure. The air pumps 96 attached to the outer pneumatic O-ring 64 will be instructed to start inflating the outer pneumatic O-ring 64 and to continue to inflate the outer pneumatic O-ring 64 until the pressure sensor 71 in the zone between the inner and outer pneumatic O-rings 64 detects a vacuum, indicating the formation of another seal. The controller 90 will then instruct air pumps 96 attached to the outer pneumatic O-ring 64 to stop inflating and maintain the inner pneumatic O-ring 64 at a constant pressure. In other embodiments, more than two pneumatic O-rings 64 inflatable to different thicknesses may be placed on the chuck 56 to secure the carrier wafer 100.

FIGS. 9A and 9B illustrate other embodiments including combinations of different types of O-rings in addition to the embodiments disclosed in the descriptions of FIGS. 6A-6E, 7A-7C, and 8A-8E. For example, in an embodiment illustrated in FIG. 9A, a chuck may have an inner O-ring 62b with a fixed thickness and position on the chuck surface and an outer O-ring 60 disposed on support rings 72 with a moveable vertical position relative to the surface of the chuck. In another embodiment illustrated in FIG. 9B, a chuck may have an inner O-ring 62b with a fixed thickness and position on the chuck surface and an outer pneumatic O-ring 64. In yet another embodiment, a chuck may have an inner O-ring 60 disposed on support rings 72 with a moveable vertical position relative to the surface of the chuck and an outer pneumatic O-ring 64.

FIGS. 10 through 16 illustrate cross-sectional views of later steps during a process for forming a first package structure in accordance with some embodiments (e.g., to form a component of an InFO package).

Figure 10:
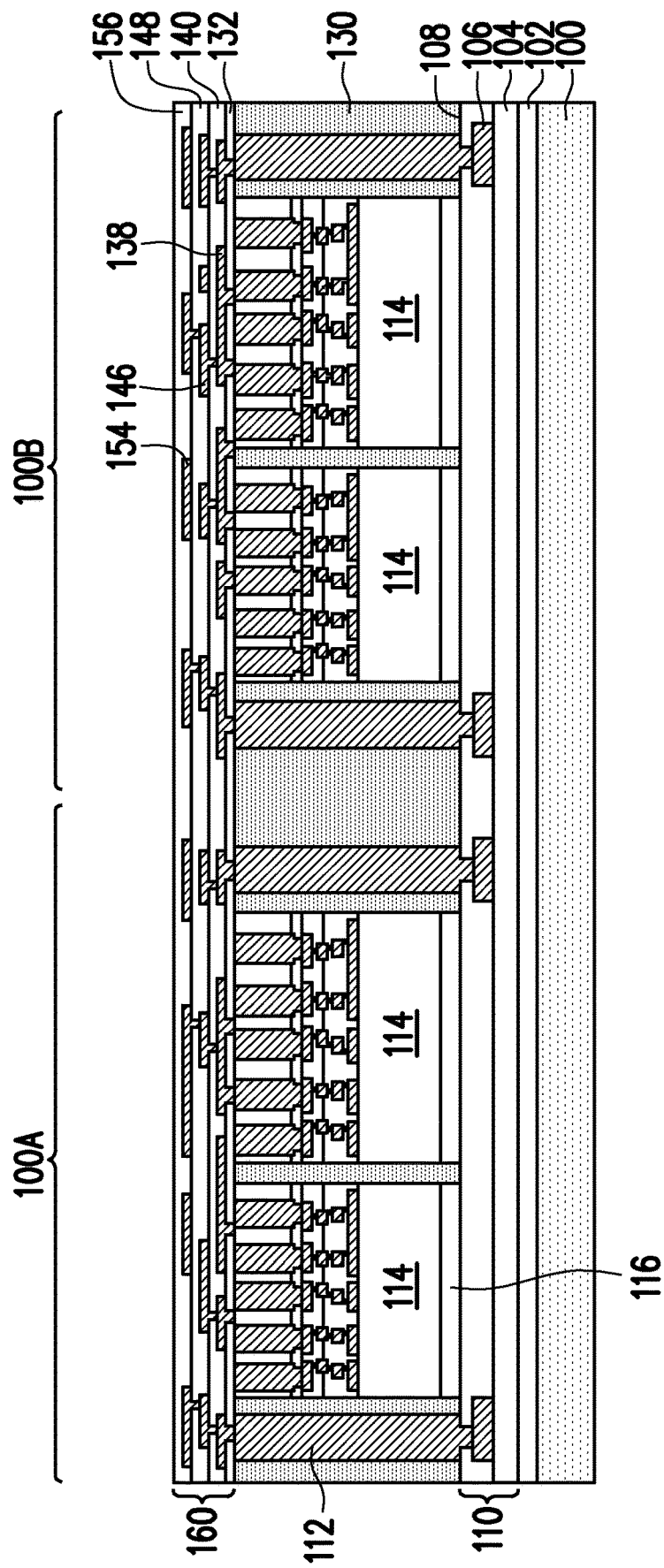
FIGS. 10-16 illustrate varying views of intermediary steps of manufacturing a semiconductor package according to various embodiments.

In FIG. 10, a front-side redistribution structure 160 is formed using steps, e.g. the forming of dielectric layers, patterning using a lithography mask, and the forming of metallization features or the like as described below, during which the carrier wafer is held securely on a chuck such as chucks 50, 54, 56, or the like discussed above. As will be illustrated in FIG. 10, the front-side redistribution structure 160 includes dielectric layers 132, 140, 148, and 156 and metallization patterns 138, 146, and 154.

In FIG. 10, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof. The dielectric layer 132 is then patterned. The patterning forms openings to expose through vias 112 and die connectors 126. The patterning may be by an acceptable process, such as by exposing the dielectric layer 132 to light when the dielectric layer is a photo-sensitive material or by etching using, for example, an anisotropic etch. If the dielectric layer 132 is a photo-sensitive material, the dielectric layer 132 can be developed after the exposure.

Metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The patterning forms openings through the photo resist in order to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., through vias 112 and die connectors 126.

Using substantially similar methods as described above with respect to dielectric layer 132 and metallization pattern with vias 138, dielectric layers 140, 148, and 156 and metallization patterns with vias 146 and 154 may be deposited and patterned, respectively, to form the front-side redistribution structure 160. The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 11:
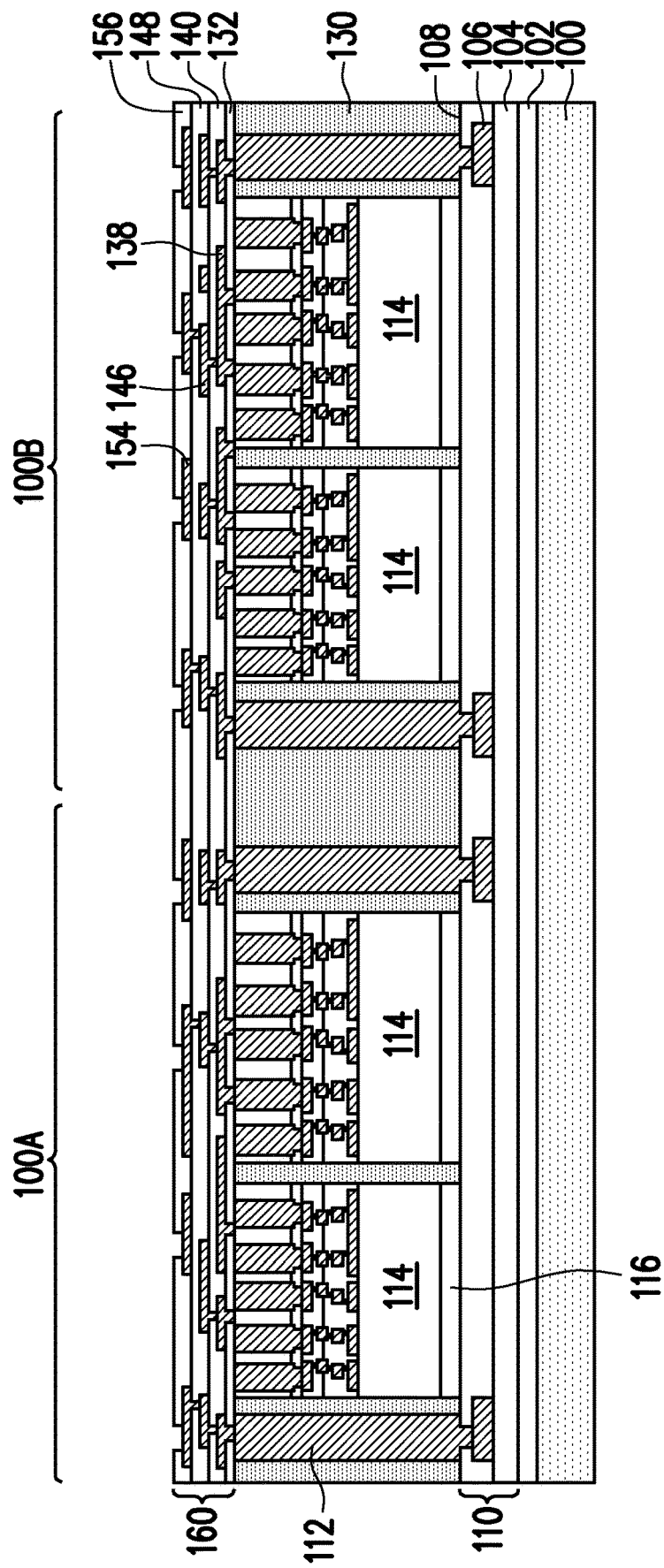

In FIG. 11, the dielectric layer 156 is then patterned. The patterning forms openings to expose portions of the metallization pattern 154. The patterning may be by an acceptable process substantially similar to the patterning of the dielectric layers 132, 140, and 148, as described above with respect to FIG. 10.

Although the redistribution layer (RDL) routing design described herein is discussed with respect to the front-side redistribution structure 160, the teachings of the RDL routing process may also be applied to the back-side redistribution structure 110.

The front-side redistribution structure 160 is formed while the carrier wafer is held securely on a chuck such as chucks 50, 54, 56, or the like described above. The chuck holds the carrier wafer 100 securely so that the vacuum sealing between the chuck and the carrier wafer 100 is not interrupted, allowing for longer uninterrupted processing tool usage to form the front-side redistribution structure 160. Additionally, the secure hold of the carrier wafer 100 by the chuck allows for greater accuracy during the steps of forming the front-side redistribution structure 160, such as e.g. reduced misalignment of various patterning steps when forming the various RDLs.

Figure 12:
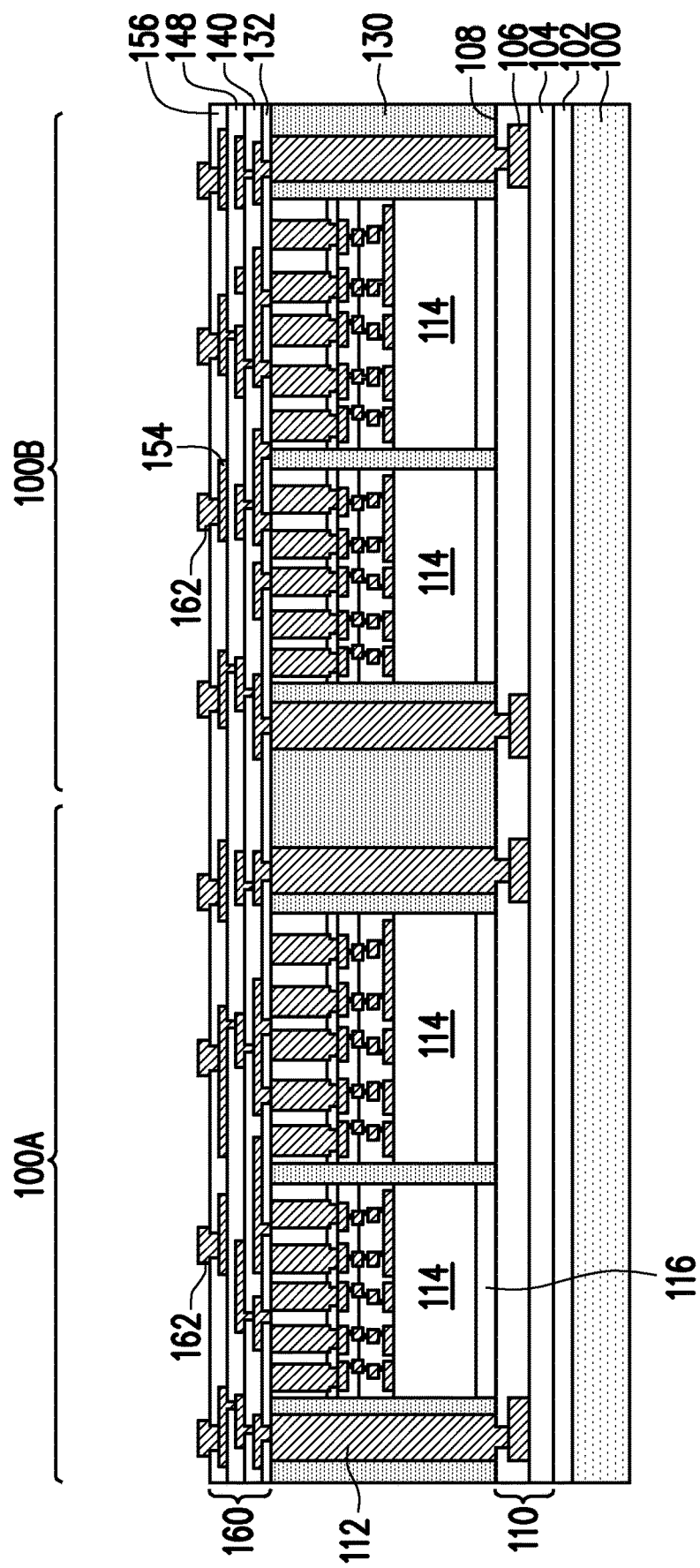

In FIG. 12, pads 162 are formed on an exterior side of the front-side redistribution structure 160. The pads 162 are used to couple to conductive connectors 166 (see FIG. 13) and may be referred to as under bump metallurgies (UBMs) 162. In the illustrated embodiment, the pads 162 are formed through openings through the dielectric layer 156 to the metallization pattern 154. The pads 162 may be formed by a method substantially similar to the method used to form metallization pattern 138 with vias as described above with respect to FIG. 10.

Figure 13:
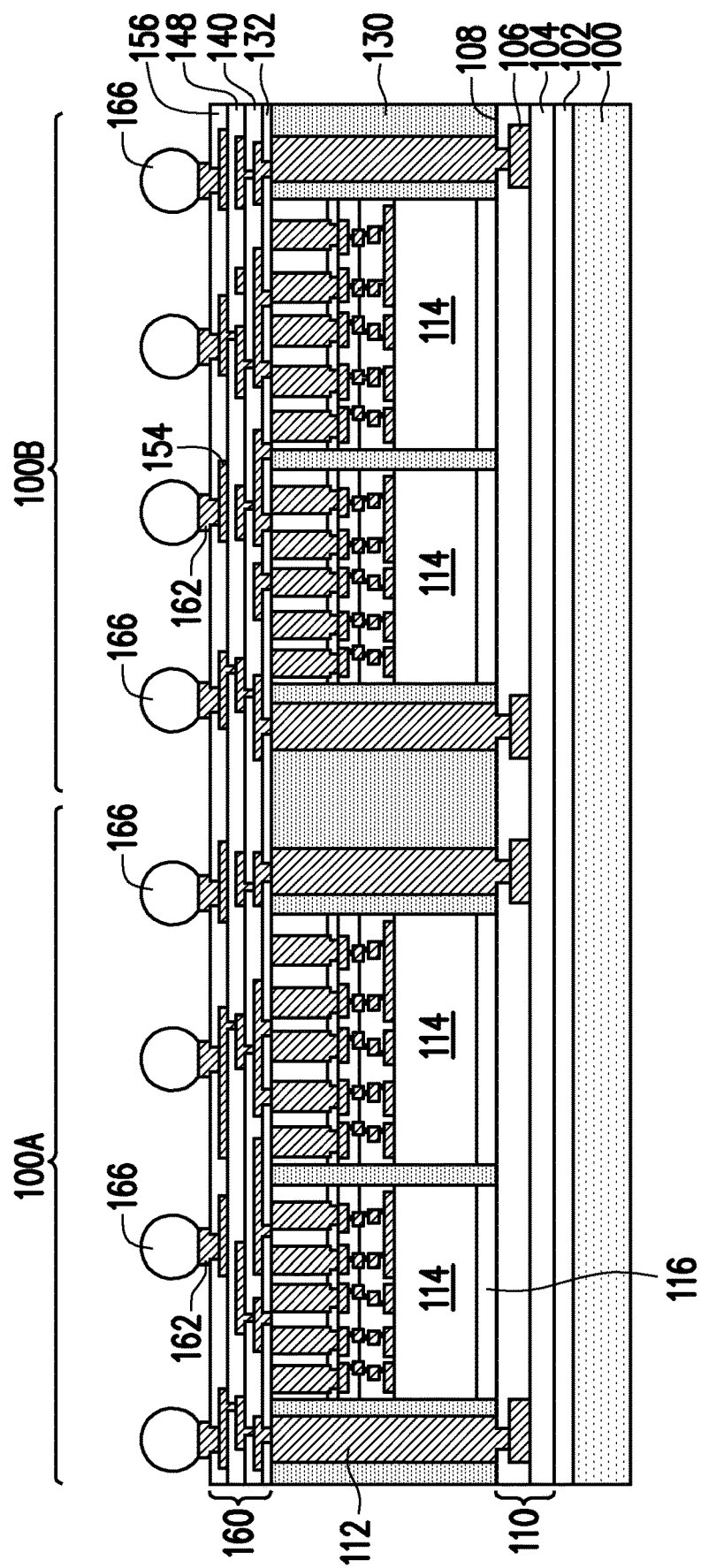

In FIG. 13, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like.

Figure 14:
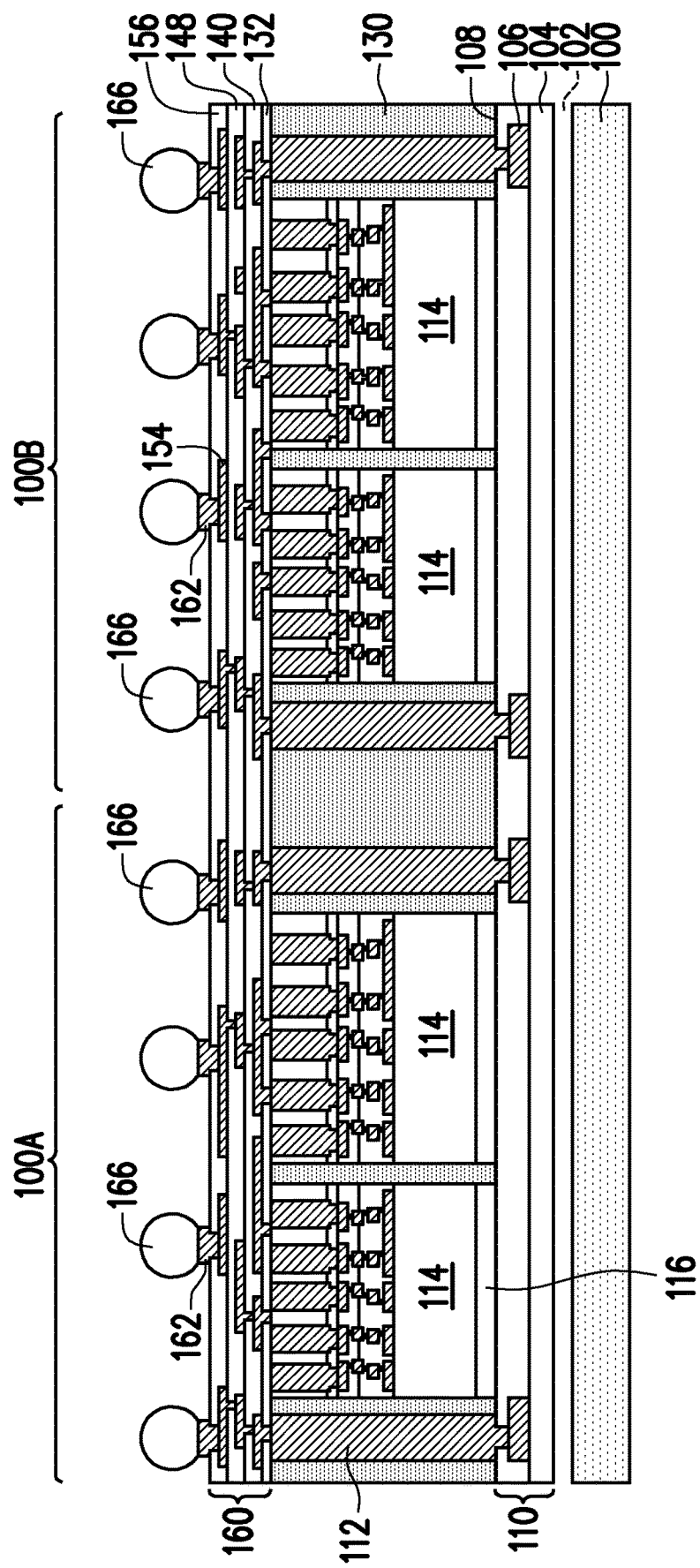

In FIG. 14, a carrier substrate de-bonding is performed to detach (de-bond) the carrier wafer 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier wafer 100 can be removed. The structure is then flipped over and placed on a tape 190, as illustrated in FIG. 15.

Figure 15:
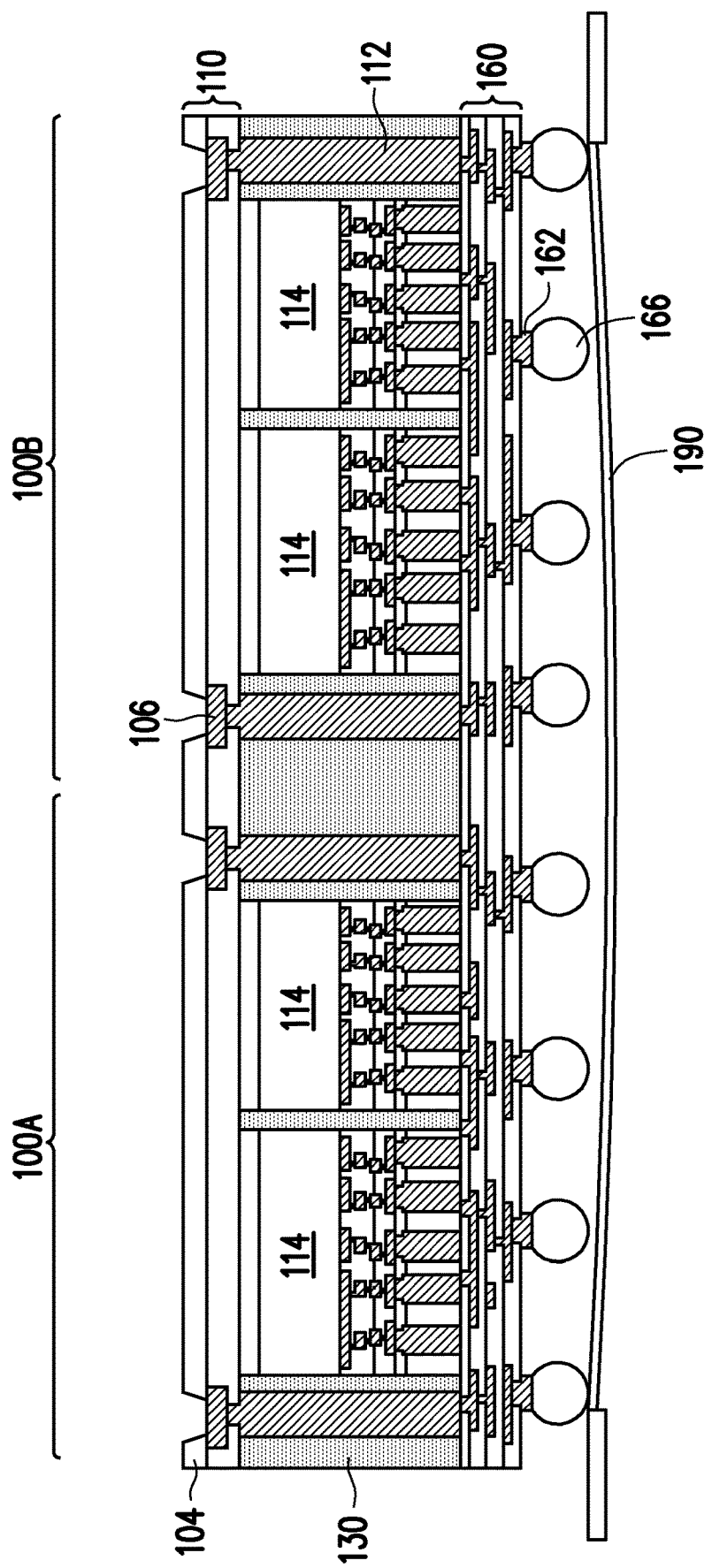

As further illustrated in FIG. 15, openings are formed through the dielectric layer 104 to expose portions of the metallization pattern 106. The openings may be formed, for example, using laser drilling, etching, or the like.

Figure 16:
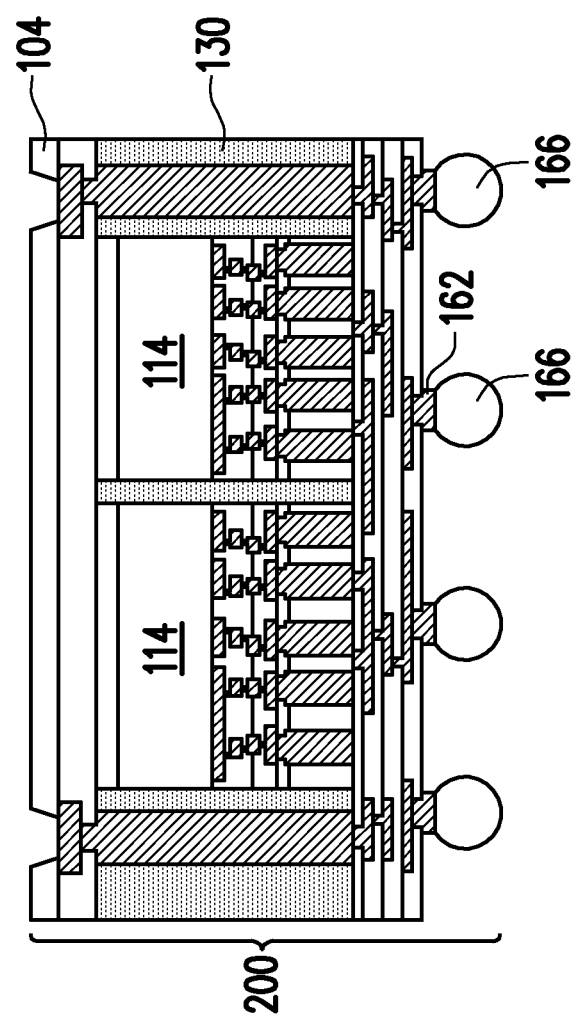

In FIG. 16, a singulation process is performed by sawing 184 along scribe line regions e.g., between adjacent regions 600 and 602. The sawing 184 singulates the first package region 600 from the second package region 602.

FIG. 16 illustrates a resulting, singulated package 200, which may be from one of the first package region 600 or the second package region 602. The package 200 may also be referred to as an integrated fan-out (InFO) package 200.

As discussed above, the embodiments of chucks and O-rings with variable configurable heights disclosed here are useful for securing substrates or wafers with significant warping or stiffness during semiconductor fabrication processes such as, e.g. stitching lithography, etching, or deposition of conductive or insulating material. By securing the substrate during processing with O-rings of variable heights, loss of vacuum underneath the substrate is prevented. This enables processing tool usage without interruption due to loss of the vacuum seal between the substrate and the chuck. Additionally, the semiconductor fabrication processes may be executed with greater precision due to the substrate being held securely in place.

In accordance with an embodiment, an apparatus for securing a wafer includes: a chuck; at least one O-ring disposed on the chuck, wherein a height of the O-ring is adjustable; a vacuum system connected to the chuck, wherein the vacuum system includes a plurality of vacuum holes through the chuck connected to one or more vacuum pumps; and a controller configured to control the height of the at least one O-ring relative to a top surface of the chuck, wherein the controller is connected to pressure sensors capable of detecting a vacuum. In an embodiment, the at least one O-ring includes a plurality of O-rings. In an embodiment, the apparatus further includes at least one support ring disposed in at least one circular trench in the chuck, wherein the at least one O-ring is disposed on the at least one support ring. In an embodiment, the controller is connected to the vacuum system, and the controller is configured to change a vertical position of the at least one support ring while the vacuum system is activated and to stop moving the vertical position of the at least one support ring when a vacuum at a top surface of the chuck is detected by the pressure sensors. In an embodiment, the at least one support ring includes multiple independent segments. In an embodiment, the at least one O-ring includes at least one pneumatic O-ring. In an embodiment, the controller is connected to at least one air pump configured to inflate the at least one pneumatic O-ring. In an embodiment, the vacuum system is connected to the controller, and wherein the controller is configured to inflate the at least one pneumatic O-ring while the vacuum system is activated and to stop inflating and hold the at least one pneumatic O-ring at a constant pressure when the pressure sensors detect a vacuum at a top surface of the chuck.

In accordance with another embodiment, an apparatus for holding a substrate in place includes: a chuck, wherein the chuck includes a plurality of vacuum holes and a first support ring, the first support ring being moveable to extend through a top surface of the chuck, the first support ring enclosing a center point of the chuck in a top view; and a plurality of O-rings on a top surface of the chuck, wherein the O-rings have substantially different thicknesses. In an embodiment, a first O-ring of the plurality of O-rings is disposed closer to the center of the chuck than a second O-ring of the plurality of O-rings, wherein the first O-ring has a first thickness, wherein the second O-ring has a second thickness, and wherein the first thickness is smaller than the second thickness. In an embodiment, a first O-ring of the plurality of O-rings is disposed closer to the center of the chuck than a second O-ring of the plurality of O-rings, wherein the first O-ring has a first thickness, wherein the second O-ring has a second thickness, and wherein the first thickness is greater than the second thickness. In an embodiment, the first support ring includes segments, the segments having respective separately adjustable vertical positions. In an embodiment, at least one O-ring of the plurality of O-rings is a pneumatic O-ring.

In accordance with yet another embodiment, a method for processing a substrate includes: disposing one or more O-rings on a chuck; adjusting a height of the one or more O-rings relative to a top surface of the chuck; placing a substrate on the one or more O-rings; activating a vacuum system configured to produce a vacuum between the substrate and the chuck; forming a seal between the substrate and the chuck; and performing a fabrication process on the substrate. In an embodiment, the adjusting the height of the one or more O-rings includes disposing a plurality of O-rings on the chuck, wherein the plurality of O-rings have substantially different thicknesses from each other. In an embodiment, the adjusting the height of the one or more O-rings includes changing vertical positions of segments of one or more support rings on which the one or more O-rings is disposed. In an embodiment, the changing the vertical positions of the segments of the one or more support rings is controlled by a controller, wherein the controller is connected to the vacuum system, wherein the controller is configured to stop changing the vertical positions of the one or more support rings when pressure sensors detect a vacuum between the chuck and the substrate. In an embodiment, the one or more of the O-rings includes one or more pneumatic O-rings, wherein the adjusting the height of the one or more O-rings includes inflating the one or more pneumatic O-rings with at least one air pump. In an embodiment, the at least one air pump is connected to a controller, wherein the controller is connected to the vacuum system, wherein the controller is configured to stop inflating the one or more pneumatic O-rings when pressure sensors detect a vacuum between the chuck and the substrate. In an embodiment, the adjusting the height of the one or more O-rings includes disposing a multiplicity of O-rings on the chuck, wherein the multiplicity of O-rings have substantially different thicknesses from each other, and wherein adjusting the height of the one or more O-rings further includes changing vertical positions of segments of at least one support ring on which at least one of the multiplicity of O-rings is disposed.

In accordance with yet another embodiment, an apparatus for securing a wafer includes: a chuck, the chuck including a vacuum hole through the chuck, the vacuum hole being connected to a vacuum pump; a first O-ring disposed on the chuck, wherein a height of the first O-ring is adjustable; and a controller configured to control the height of the first O-ring relative to a top surface of the chuck, wherein controlling the height of the first O-ring includes changing vertical positions of segments of a support ring on which the first O-ring is disposed, the support ring being moveable with respect to the top surface of the chuck, wherein the support ring surrounds a central axis of the chuck in a top view. In an embodiment, the controller is connected to a pressure sensor capable of detecting a vacuum. In an embodiment, the pressure sensor is disposed on the top surface of the chuck. In an embodiment, the pressure sensor is disposed inside the vacuum hole. In an embodiment, the pressure sensor is an internal component of the vacuum pump. In an embodiment, the apparatus further includes a second O-ring being disposed on the chuck, the second O-ring being a pneumatic O-ring. In an embodiment, the controller is further configured to control the height of the second O-ring by inflating the second O-ring with an air pump connected to the controller.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for securing a wafer, the apparatus comprising:
    a chuck;
    a plurality of O-rings disposed on the chuck, wherein the plurality of O-rings are concentric rings in a top view, wherein a first O-ring of the plurality of O-rings and a second O-ring of the plurality of O-rings have different thicknesses, and wherein a height of the first O-ring of the plurality of O-rings is adjustable;
    a vacuum system connected to the chuck, wherein the vacuum system comprises a plurality of vacuum holes through the chuck connected to one or more vacuum pumps; and
    a controller configured to control the height of the the first O-ring of the plurality of O-rings relative to a top surface of the chuck wherein the controller is connected to pressure sensors capable of detecting a vacuum, wherein the first O-ring of the plurality of O-rings is a pneumatic O-ring, and wherein the controller is connected to at least one air pump configured to inflate the first O-ring of the plurality of O-rings.

2. The apparatus of claim 1, further comprising at least one support ring disposed in at least one circular trench in the chuck, wherein the at least one O-ring is disposed on the at least one support ring.

3. The apparatus of claim 2, wherein the controller is connected to the vacuum system, and wherein the controller is configured to change a vertical position of the at least one support ring while the vacuum system is activated and to stop moving the vertical position of the at least one support ring when a vacuum at a top surface of the chuck is detected by the pressure sensors.

4. The apparatus of claim 3, wherein the at least one support ring comprises multiple independent segments.

5. The apparatus of claim 1, wherein the vacuum system is connected to the controller, and wherein the controller is configured to inflate the at least one pneumatic O-ring while the vacuum system is activated and to stop inflating and hold the at least one pneumatic O-ring at a constant pressure when the pressure sensors detect a vacuum at a top surface of the chuck.

6. The apparatus of claim 2, wherein at least one support ring is attached to an electric motor, and wherein the electric motor is connected to the controller.

7. The apparatus of claim 4, wherein vertical positions of the multiple independent segments are individually adjusted by the controller.

8. An apparatus for holding a substrate in place, the apparatus comprising:
   a chuck, wherein the chuck comprises:
      a plurality of vacuum holes; and
      a first support ring, the first support ring being moveable to extend through a top surface of the chuck, the first support ring enclosing a center point of the chuck in a top view, the first support ring comprising segments, and the segments having respective separately adjustable vertical positions; and
   a plurality of O-rings on a top surface of the chuck, wherein the plurality of O-rings are disposed in a concentric pattern in the top view, wherein a first O-ring of the plurality of O-rings and a second O-ring of the plurality of O-rings have substantially different thicknesses, and wherein the second O-ring is on the first support ring.

9. The apparatus of claim 8, wherein the first O-ring of the plurality of O-rings is disposed closer to the center of the chuck than the second O-ring of the plurality of O-rings, wherein the first O-ring has a first thickness, wherein the second O-ring has a second thickness, and wherein the first thickness is smaller than the second thickness.

10. The apparatus of claim 8, wherein the first O-ring of the plurality of O-rings is disposed closer to the center of the chuck than the second O-ring of the plurality of O-rings, wherein the first O-ring has a first thickness, wherein the second O-ring has a second thickness, and wherein the first thickness is greater than the second thickness.

11. The apparatus of claim 8, wherein at least one O-ring of the plurality of O-rings is a pneumatic O-ring.

12. The apparatus of claim 11, wherein the pneumatic O-ring is inflated by an air pump.

13. The apparatus of claim 8, wherein the first support ring is moved by an electric motor.

14. An apparatus for securing a wafer, the apparatus comprising:
   a chuck, the chuck comprising a vacuum hole through the chuck, the vacuum hole being connected to a vacuum pump;
   a first O-ring disposed on the chuck, wherein a height of the first O-ring is adjustable; and
   a controller configured to control the height of the first O-ring relative to a top surface of the chuck, wherein controlling the height of the first O-ring comprises changing vertical positions of segments of a support ring on which the first O-ring is disposed, the support ring being attached to an electric motor, the support ring being moveable with respect to the top surface of the chuck, wherein the support ring surrounds a central axis of the chuck in a top view.

15. The apparatus of claim 14, wherein the controller is connected to a pressure sensor capable of detecting a vacuum.

16. The apparatus of claim 15, wherein the pressure sensor is disposed on the top surface of the chuck.

17. The apparatus of claim 15, wherein the pressure sensor is disposed inside the vacuum hole.

18. The apparatus of claim 15, wherein the pressure sensor is an internal component of the vacuum pump.

19. The apparatus of claim 14, further comprising a second O-ring being disposed on the chuck, the second O-ring being a pneumatic O-ring.

20. The apparatus of claim 19, wherein the controller is further configured to control the height of the second O-ring by inflating the second O-ring with an air pump connected to the controller.

* * * * *